(12) United States Patent
Kim

(10) Patent No.: US 10,846,170 B2
(45) Date of Patent: Nov. 24, 2020

(54) DECODER, OPERATING METHOD THEREOF AND MEMORY SYSTEM INCLUDING THE DECODER

(71) Applicant: SK hynix Inc., Gyeonggi-do (KR)

(72) Inventor: Dae-Sung Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 96 days.

(21) Appl. No.: 16/279,530

(22) Filed: Feb. 19, 2019

(65) Prior Publication Data

US 2020/0057693 A1 Feb. 20, 2020

(30) Foreign Application Priority Data

Aug. 20, 2018 (KR) .................. 10-2018-0096779

(51) Int. Cl.

| | |
|---|---|
| G11C 29/00 | (2006.01) |
| G06F 11/10 | (2006.01) |
| G11C 29/52 | (2006.01) |
| G11C 11/56 | (2006.01) |
| G11C 16/08 | (2006.01) |
| G11C 16/04 | (2006.01) |

(52) U.S. Cl.
CPC ...... *G06F 11/1068* (2013.01); *G11C 11/5642* (2013.01); *G11C 16/08* (2013.01); *G11C 29/52* (2013.01); *G11C 16/0483* (2013.01)

(58) Field of Classification Search
CPC . G06F 11/1068; G11C 11/5642; G11C 16/08; G11C 16/0483; G11C 29/52

USPC ................. 714/764, 752, 755, 774
See application file for complete search history.

(56) References Cited

U.S. PATENT DOCUMENTS

| | | | |
|---|---|---|---|
| 8,261,170 B2* | 9/2012 | Yedidia ............... | H03M 13/112 |
| | | | 714/794 |
| 2016/0306694 A1 | 10/2016 | Tai et al. | |
| 2017/0033893 A1* | 2/2017 | Kang ................... | H04L 1/0051 |
| 2017/0220415 A1* | 8/2017 | Hashimoto ........... | G06F 3/064 |
| 2019/0140660 A1* | 5/2019 | Palangappa ......... | G06F 11/1068 |

FOREIGN PATENT DOCUMENTS

| | | |
|---|---|---|
| KR | 1020150115652 | 10/2015 |
| KR | 1020160113001 | 9/2016 |

* cited by examiner

*Primary Examiner* — Christine T. Tu
(74) *Attorney, Agent, or Firm* — IP & T Group LLP

(57) ABSTRACT

An operation method of a decoder may include: performing a first sub-decoding operation on a target data chunk; performing a second sub-decoding operation on candidate chunks and a chip-kill chunk; performing a third sub-decoding operation to determine a global check node; performing a fourth sub-decoding operation to infer and update local variable nodes of the target data chunk and local variable nodes of a data chunk from the global check node; and repeating the first to fourth sub-decoding operations once by a set number of times based on components of the updated local variable nodes.

31 Claims, 19 Drawing Sheets

- After 1 iteration
v = ( 0  1  1  0  1  0  0  0  1  1 )

Syndrome check

Perform next iteration

DECODER, OPERATING METHOD THEREOF AND MEMORY SYSTEM INCLUDING THE DECODER

CROSS-REFERENCE TO RELATED APPLICATION

The present application claims priority under 35 U.S.C. § 119(a) to Korean Patent Application No. 10-2018-0096779, filed on Aug. 20, 2018, the disclosure of which is incorporated herein by reference in its entirety.

BACKGROUND

1. Field

Various embodiments of the present invention relate to a decoder, operating method thereof and memory system including the decoder.

2. Description of the Related Art

In general, memory devices are classified into volatile memory devices, such as dynamic random access memory (DRAM) and static RAM (SRAM), and non-volatile memory devices, such as read only memory (ROM), Mask ROM (MROM), programmable ROM (PROM), erasable PROM (EPROM), electrically EPROM (EEPROM), ferromagnetic RAM (FRAM), phase change RAM (PRAM), magnetic RAM (MRAM), resistive RAM (RRAM) and flash memory.

Volatile memory devices lose their stored data when their power supplies are interrupted, whereas non-volatile memory devices retain their stored data even when their power supplies are interrupted. Non-volatile flash memory devices are widely used as storage mediums in computer systems because of their high program speed, low power consumption and large data storage capacity.

In non-volatile memory devices, especially in flash memory devices, the data state of each memory cell depends on the number of bits that the memory cell can program. A memory cell storing 1-bit data per cell is called a single-bit cell or a single-level cell (SLC). A memory cell storing 2-bit data per cell is called a multi-bit cell, a multi-level cell (MLC) or a multi-state cell. A memory cell storing 3-bit data per cell is called a triple-level cell (TLC). Employing the MLC and TLC are advantageous for achieving higher integration levels as compared to using SLCs. However, as the number of bits programmed in each memory cell increases, the reliability decreases and the read failure rate increases.

For example, when k bits are to be programmed in a memory cell, one of $2^k$ threshold voltages is formed in the memory cell at any given time. Due to minute differences between the electrical characteristics of memory cells, the threshold voltages of memory cells programmed for the same data form threshold voltage distributions. Threshold voltage distributions correspond to $2^k$ data values corresponding to k-bit information, respectively.

However, a voltage window available for the various threshold voltage distributions is finite. Therefore, as the value of k increases, the distance between consecutive threshold voltage distributions decreases and the probability that neighbouring threshold voltage distributions may overlap also increases. When two neighbouring threshold voltage distributions overlap, read data may include error bits.

FIG. 1 is a threshold voltage distribution illustrating program and erase states of a triple-level cell (TLC) non-volatile memory device.

FIG. 2 is a threshold voltage distribution illustrating program and erase states due to characteristic deterioration of a triple-level cell (TLC) non-volatile memory device.

In a TLC non-volatile memory device, e.g., a TLC flash memory device capable of storing 3-bit data in a single memory cell, the memory cell may have one of $2^3$ threshold voltage distributions.

Threshold voltages of memory cells programmed for the same data form a threshold voltage distribution due to characteristic differences between memory cells. In the TLC non-volatile memory device, as illustrated in FIG. 1, threshold voltage distributions are formed in correspondence with the data states including 7 program states 'P1' to 'P7' and an erase state 'E'. FIG. 1 shows an ideal case in which threshold voltage distributions do not overlap and have sufficient read voltage margins therebetween.

Referring to the flash memory example of FIG. 2, the memory cell may experience charge losses in which electrons trapped at a floating gate or tunnel oxide film are discharged over time. Such charge loss may accelerate when the tunnel oxide film deteriorates because of iterative program and erase operations. Charge losses may result in a decrease in the threshold voltages of memory cells. For example, as illustrated in FIG. 2, the threshold voltage distributions may be shifted left due to charge losses.

Further, program disturbances, erase disturbances and/or back pattern dependencies may cause increases in the threshold voltages. As the characteristics of memory cells deteriorate, neighbouring threshold voltage distributions may overlap, as illustrated in FIG. 2.

Once neighbouring threshold voltage distributions overlap, read data may include a significant number of errors when a particular read voltage is applied to a selected word line. For example, when a sensed state of a memory cell according to a read voltage Vread3 that is applied to a selected word line is on, the memory cell is determined to have a second program state 'P2'. When a sensed state of a memory cell according to a read voltage Vread3 applied to a selected word line is off, the memory cell is determined to have a third program state 'P3'. However, when neighbouring threshold voltage distributions overlap, a memory cell that has the third program state 'P3' may be erroneously determined to have the second program state 'P2'. In short, when the neighbouring threshold voltage distributions overlap as illustrated in FIG. 2, read data may include a significant number of errors.

What is therefore required is a scheme for reliably and quickly reading data stored in memory cells of a memory device, especially in multi-level memory cells of a highly-integrated memory device.

SUMMARY

Various embodiments of the present invention are directed to a controller, a memory system and an operating method thereof capable of reliably and quickly reading data stored in memory cells of a memory device such as in multi-level memory cells of a highly-integrated memory device.

In accordance with an embodiment of the present invention, an operation method of a decoder that decodes a decoding operation on a predetermined data chunk basis, the operation may include: performing a first sub-decoding operation on a target data chunk; performing a second sub-decoding operation on candidate chunks and a chip-kill chunk corresponding to the target data chunk, when the first sub-decoding operation fails; performing a third sub-decoding operation to determine a global check node based on local variable nodes of data chunks, on which the second sub-decoding operation succeeded, as success data chunks, when there are one or more data chunks on which the second sub-decoding operation failed; performing a fourth sub-decoding operation to infer and update local variable nodes of the target data chunk and local variable nodes of a data chunk, on which the second sub-decoding operation failed, as fail data chunk, from the global check node; and repeating the first to fourth sub-decoding operations once by a set number of times based on components of the updated local variable nodes.

In accordance with an embodiment of the present invention, a decoder that decodes a decoding operation on a predetermined data chunk basis, may include: a first decoder suitable for performing a first sub-decoding operation on a target data chunk, and performing a second sub-decoding operation on candidate data chunks and a chip-kill chunk corresponding to the target data chunk, when the first sub-decoding operation failed; a global check node component suitable for performing a third sub-decoding operation to determine a global check node based on local variable nodes of data chunks, on which the second sub-decoding operation failed, as success data chunks, when there are one or more data chunks on which the second sub-decoding operation failed; and a data combiner suitable for performing a fourth sub-decoding operation to infer and update local variable nodes of the target data chunk and local variable nodes of a data chunk, on which the second sub-decoding failed, as fail data chunk, from the global check node, wherein the decoder repeats the first to fourth sub-decoding operations once by a set number of times based on components of the updated local variable nodes.

In accordance with an embodiment of the present invention, an memory system may include: a memory device suitable for storing data; and a controller suitable for reading data from the memory device and decoding the read data, wherein the controller comprises: a first decoder suitable for performing a first sub-decoding operation on a target data chunk, and performing a second sub-decoding operation on candidate data chunks and a chip-kill chunk corresponding to the target data chunk, when the first sub-decoding operation failed; a global check node component suitable for performing a third sub-decoding operation to determine a global check node based on local variable nodes of data chunks on which the second sub-decoding operation succeeded, as success data chunks, when there are one or more data chunks on which the second sub-decoding operation failed; and a data combiner suitable for performing a fourth sub-decoding operation to infer and update local variable nodes of the target data chunk and local variable nodes of a data chunk on which the second sub-decoding operation failed, as fail data chunk, from the global check node, wherein the decoder repeats the first to fourth sub-decoding operations once by a set number of times based on components of the updated local variable nodes.

In accordance with an embodiment of the present invention, a decoder may include: a first decoder suitable for: performing a first sub-decoding operation on a target data chunk, and when the first sub-decoding operation failed, performing a second sub-decoding operation on candidate data chunks and a chip-kill chunk corresponding to the target data chunk; and a second decoder suitable for: when among the candidate data chunks and the chip-kill chunk, there is at least one data chunk on which the second sub-decoding operation failed (failed data chunk), performing a third sub-decoding operation based on data chunks including data chunks on which the second sub-decoding operation succeeded to generate a global check node, and performing a fourth sub-decoding operation on the target data chunk and the fail data chunk based on information of the global check node to update local variable nodes of the target data chunk for the first sub-decoding operation.

BRIEF DESCRIPTION OF THE DRAWINGS

The above and other features and advantages of the present invention will become more apparent to those skilled in the art to which the present invention pertains by the following detailed description with reference to the attached drawings identified below.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure is thorough and complete and fully conveys the present invention to those skilled in the art. The scope of the present invention will be understood through the claims of the present invention.

It is noted that the drawings are not necessarily to scale and, in some instances, proportions may have been exaggerated in order to more clearly illustrate the various elements of the embodiments.

Also, in the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment, unless specifically indicated otherwise. Also, throughout the specification reference to "an embodiment," "another embodiment" or the like is not necessarily to only one embodiment, and different references to any such phrase are not necessarily to the same embodiment(s).

Various embodiments of the present invention now will be described in detail with reference to the attached drawings.

Figure 1:
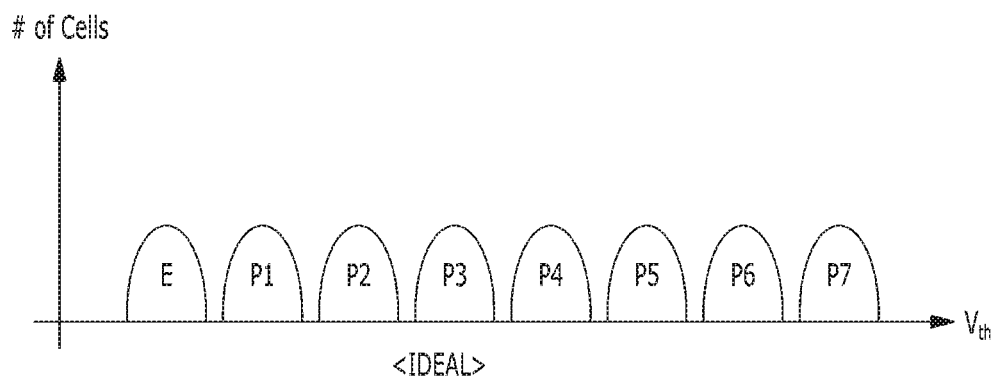
FIG. 1 is a diagram showing a threshold voltage distribution illustrating program and erase states of a triple-level cell (TLC) non-volatile memory device.
Figure 2:
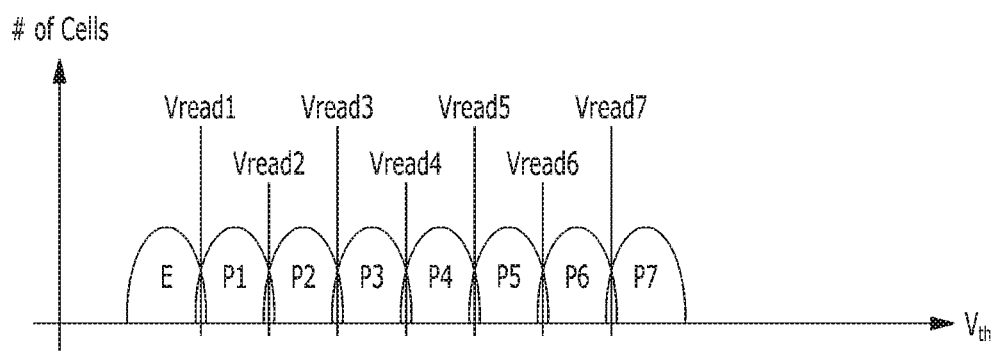
FIG. 2 is a diagram showing a threshold voltage distribution illustrating program and erase states due to characteristic deterioration of a triple-level cell (TLC) non-volatile memory device.
Figure 3:
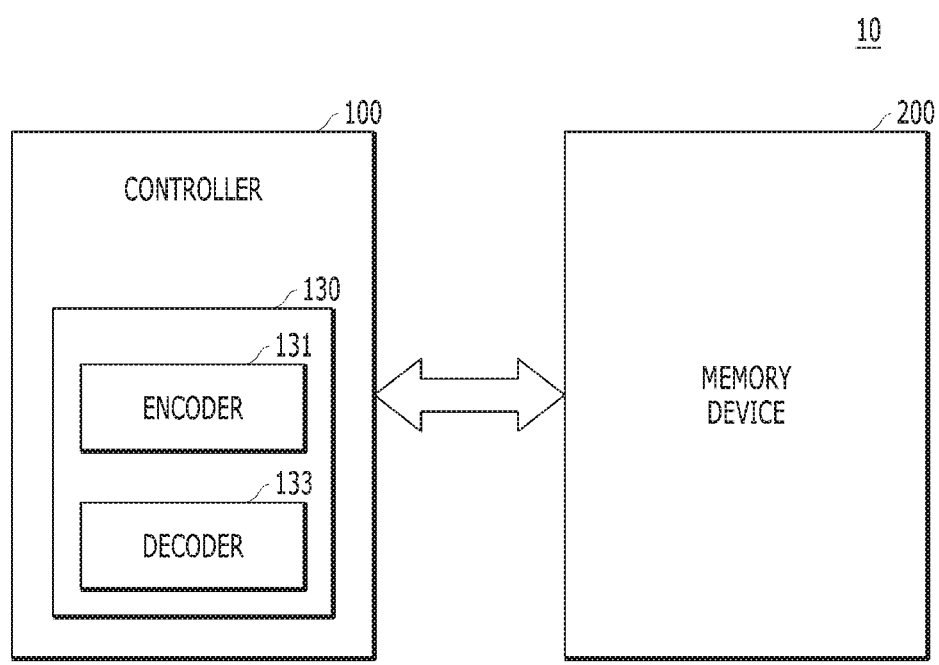
FIG. 3 is a block diagram illustrating a memory system in accordance with an embodiment of the present invention.

FIG. 3 is a block diagram illustrating a memory system 10 in accordance with an embodiment of the present invention.

Figure 4A:
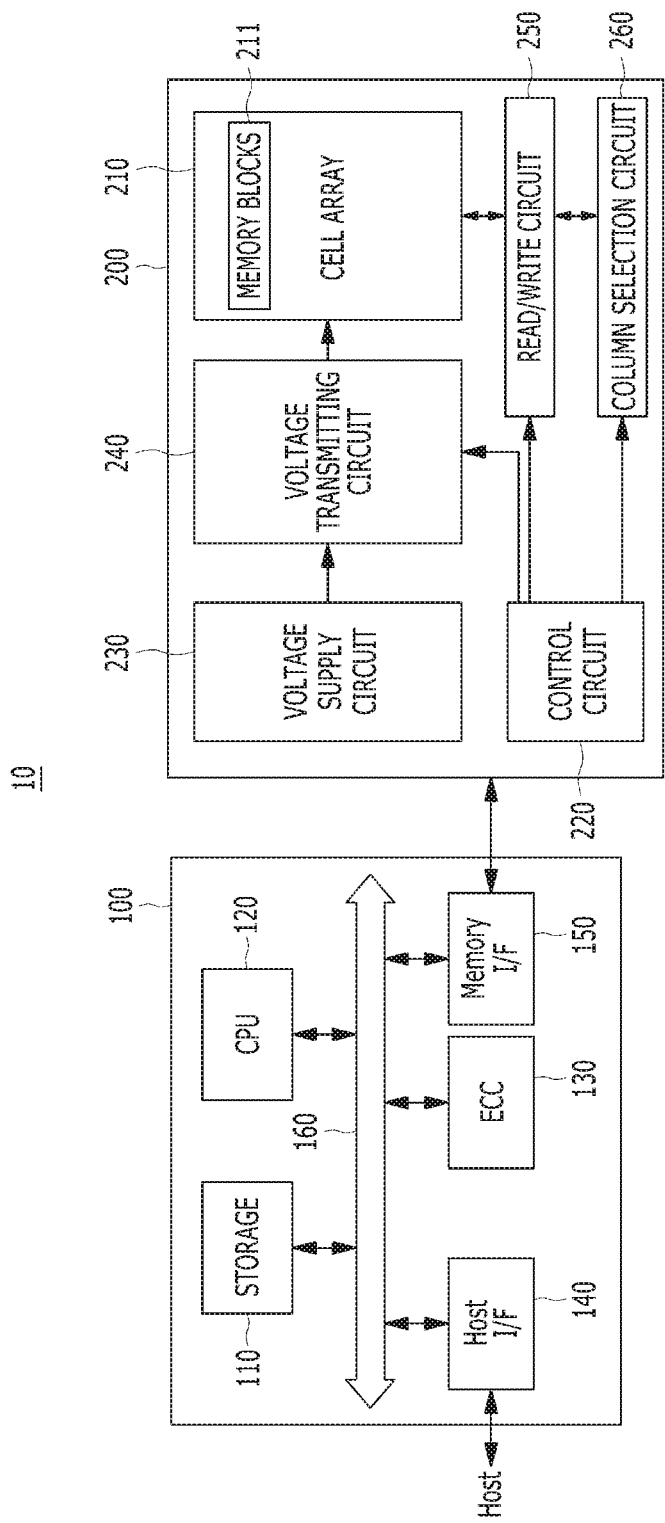
FIG. 4A is a detailed block diagram illustrating the memory system of FIG. 3.

FIG. 4A is a detailed block diagram illustrating the memory system 10 of FIG. 3.

Figure 4B:
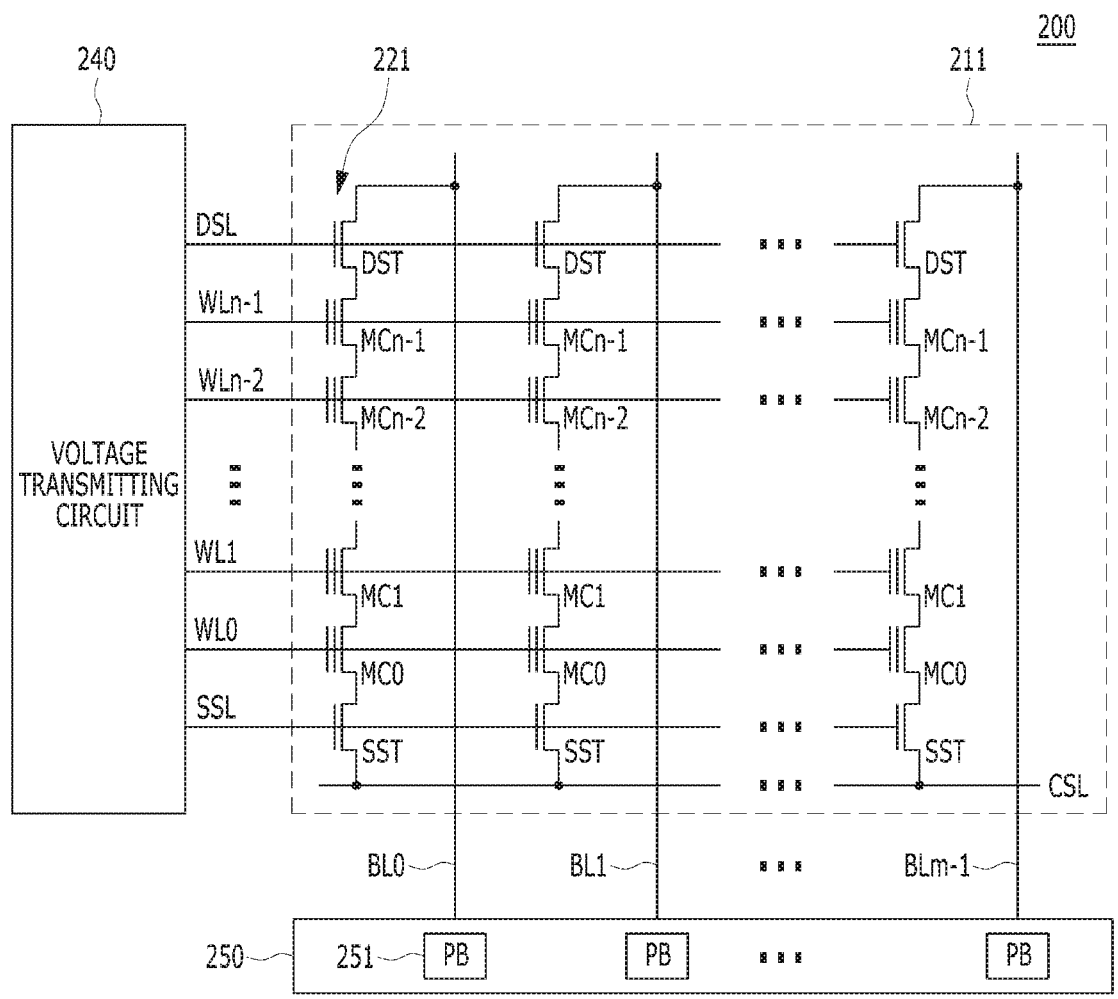
FIG. 4B is a circuit diagram illustrating an exemplary configuration of a memory block employed in the memory system of FIG. 4A.

FIG. 4B is a circuit diagram illustrating an exemplary embodiment of a memory block 211.

Figure 5:
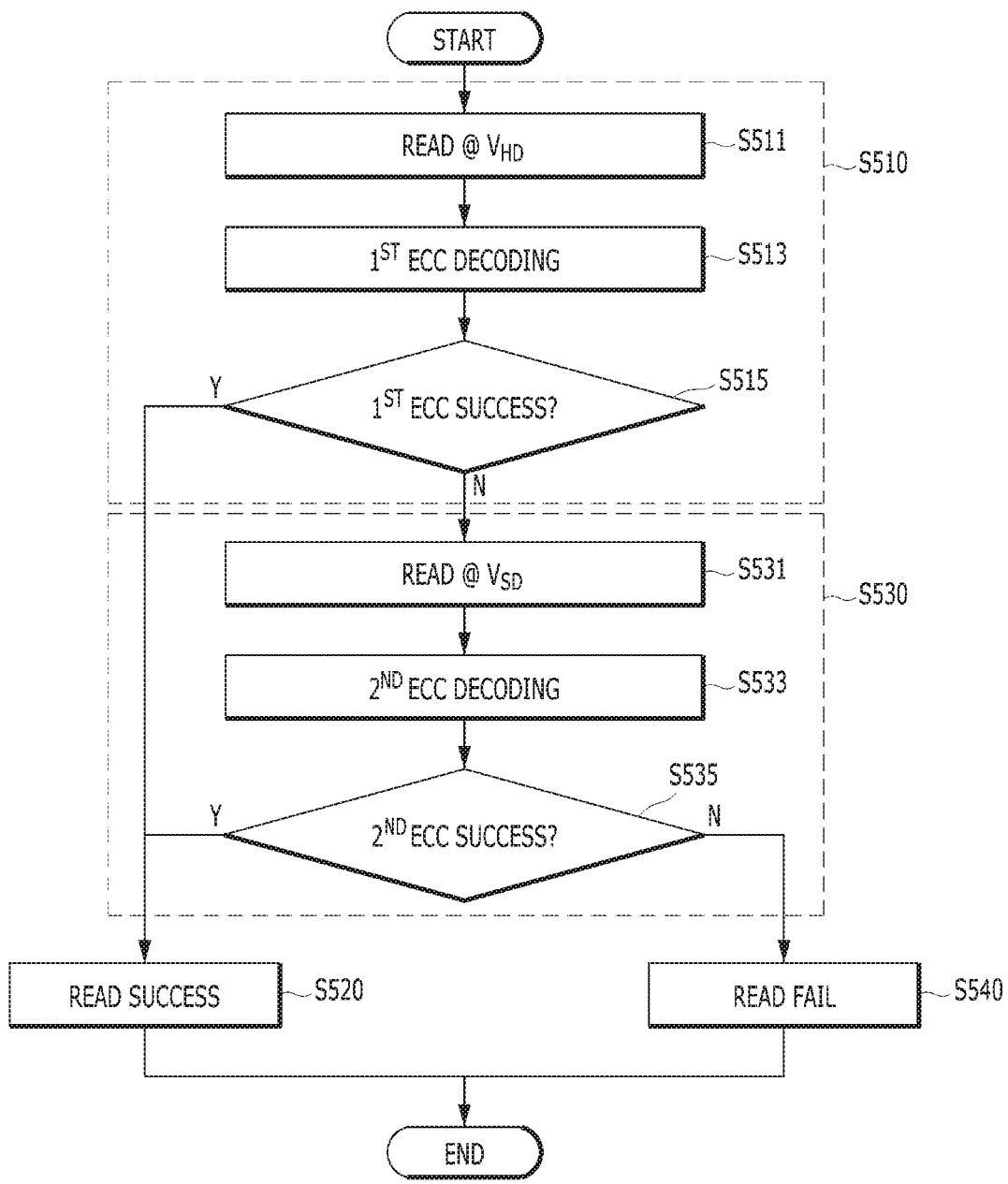
FIG. 5 is a flowchart illustrating an operation of a controller, such as that employed in the memory system of FIG. 4A, in accordance with an embodiment of the present invention.

FIG. 5 is a flowchart illustrating an operation of a controller, e.g., controller 100 employed in the memory system 10, in accordance with an embodiment of the present invention.

Referring to FIGS. 3 to 5, the memory system 10 may include a controller 100 and a memory device 200. The controller 100 may be operatively coupled to the memory device 200.

The memory device 200 may perform one or more of an erase, a program, and a read operation under the control of the controller 100. The memory device 200 may receive a command CMD, an address ADDR and data DATA through one or more input/output lines from the controller 100. The memory device 200 may be provided with power PWR through a power line and receive a control signal CTRL through a control line from the controller 100. The control signal may include a command latch enable (CLE) signal, an address latch enable (ALE) signal, a chip enable (CE) signal, a write enable (WE) signal, and a read enable (RE) signal.

The controller 100 may control the overall operations of the memory device 200. The controller 100 may include an error correction code (ECC) component 130 for correcting error bits. The ECC component (hereafter, ECC) 130 may include an encoder 131 and a decoder 133. The ECC 130 may be configured as a combination of hardware, software and firmware.

The encoder 131 may perform an error correction encoding operation on data to be programmed into the memory device 200 to output encoded data to which parity bits are added. The encoded data with the parity bits may be stored in the memory device 200.

The decoder 133 may perform an error correction decoding operation on data read from the memory device 200. The decoder 133 may determine whether the error correction decoding operation is successful, and may output an instruction signal based on the determination result. The decoder 133 may correct error bits of data using the parity bits generated by an encoding operation (e.g., a low-density parity-check (LDPC) encoding operation).

When the number of error bits exceeds the error correction capacity of the ECC 130, it may not correct the error bits. In this case, the ECC 130 may generate an error correction fail signal.

The ECC 130 may correct an error through a coded modulation such as a low-density parity-check (LDPC) code, a Bose-Chaudhuri-Hocquenghem (BCH) code, a turbo code, a Reed-Solomon (RS) code, a convolution code, a Recursive Systematic Code (RSC), a Trellis-Coded Modulation (TCM), and a Block Coded Modulation (BCM). The ECC 130 may include any and all circuits, systems, or devices for error correction.

The controller 100 and the memory device 200 may be integrated in a single semiconductor device. For example, the controller 100 and the memory device 200 may be integrated in a single semiconductor device such as a solid-state drive (SSD). The SSD may store data in the memory device 200. When the memory system 10 is used in an SSD, the operation speed of a host (not shown) which may be coupled to the memory system 10 may be improved significantly.

The controller 100 and the memory device 200 may be integrated in a single semiconductor device to form a memory card such as a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and/or a universal flash storage (UFS).

For another example, the memory system 10 may be provided as one of various elements comprising an electronic device such as a computer, an ultra-mobile personal computer (PC) (UMPC), a workstation, a net-book computer, a personal digital assistants (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, one of electronic devices of a home network, one of electronic devices of a computer network, one of electronic devices of a telematics network, an radio-frequency identification (RFID) device, or elements devices of a computing system.

Referring to FIG. 4A, the controller 100 may include besides the ECC 130, a storage 110, a central processing unit (CPU) 120, a host interface (I/F) 140, a memory interface 150 and a system bus 160. The storage 110 may operate as a working memory of the CPU 120.

The host interface 140 may communicate with a host through one or more of various interface protocols such as a universal serial bus (USB), a multi-media card (MMC), a peripheral component interconnect express (PCI-e or PCIe), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The ECC 130 may detect and correct error bits including data read the memory device 200.

The memory interface 150 may interface with the memory device 200. The CPU 120 may perform various control operations.

In accordance with an embodiment, the ECC 130 may perform a LDPC encoding for original data to be programmed to the memory device 200. The ECC 130 may perform LDPC decoding of encoded data (e.g., codeword) programmed to memory device 200 in connection with a reading operation. The ECC 130 may recover the codeword to recreate original data.

The memory device 200, may include a memory cell array 210, a control circuit 220, a voltage supply circuit 230, a voltage transmitting circuit 240, a read and write (read/write) circuit 250, and a column selection circuit 260.

The memory cell array 210 may include a plurality of memory blocks 211. Data including user data may be stored in the memory blocks 211.

Referring to FIG. 4B, each of the memory blocks 211 may include a plurality of cell strings 221 electrically coupled to a plurality of corresponding bit lines BL0 to BLm−1, respectively. Each of the cell strings 221 may include one or more drain selection transistors DST and one or more source selection transistors SST. A plurality of memory cells or memory cell transistors may be serially coupled between the drain and the source selection transistors DST and SST. Each of the memory cells MC0 to MCn−1 may be preferably formed of a multi-level cell (MLC) storing data (or information) of multiple bits in each cell.

FIG. 4B exemplarily illustrates a memory block 211 comprising a plurality of NAND-type flash memory cells. However, the memory block 211 of the memory device 200 is not limited in this way. For example, the memory block 211 may comprise a plurality of NOR-type flash memory cells, or a plurality of hybrid flash memory cells in which two or more types of memory cells are combined. In an embodiment employing a NAND flash memory, a controller may be embedded inside a memory chip. Operation characteristics of the memory device may be applied to a charge trap flash (CTF) in which a charge storing layer is formed by an insulating layer, as well as the flash memory device in which a charge storing layer is formed by a conductive floating gate.

Referring back to FIG. 4A, the control circuit 220 may control overall operations related to program, erase, and read operations of the memory device 200.

The voltage supply circuit 230 may provide word line voltages, for example, a program voltage, a read voltage, and a pass voltage, to the respective word lines as may be needed according to an operation mode. Further, the voltage supply circuit 230 may provide a voltage to be supplied to a bulk, for example, a well region in which the memory cells are formed. A voltage generating operation of the voltage supply circuit 230 may be performed under the control of the control circuit 220.

The voltage supply circuit 230 may generate a plurality of variable read voltages corresponding to the various threshold voltage distributions of the memory cells for generating a plurality of read data.

The voltage transmitting circuit 240 may select one of the memory blocks 211 or sectors of the memory cell array 210, and may select one of the word lines of the selected memory block under the control of the control circuit 220. The voltage transmitting circuit 240 may provide the word line voltage generated from the voltage supply circuit 230 to selected word lines or non-selected word lines under the control of the control circuit 220. For example, the voltage transmitting circuit 240 may transmit one of the plurality of read voltages to a selected word line of a selected memory block and a pass voltage to the unselected word lines of the selected memory block.

The read/write circuit 250 may be controlled by the control circuit 220 and may operate as a sense amplifier or a write driver according to an operation mode. For example, during a verification/normal read operation, the read/write circuit 250 may operate as a sense amplifier for reading data from the memory cell array 210. During a normal read operation, the column selection circuit 260 may output the data read from the read/write circuit 250 to the outside, for example, to the controller 100, based on column address information. On the other hand, during a verification read operation, the read data may be provided to a pass/fail verification circuit (not illustrated) included in the memory device 200, and may be used for determining whether a program operation of the memory cell succeeds.

During a program operation, the read/write circuit 250 may operate as a write driver for driving the bit lines according to data to be stored in the memory cell array 210. During a program operation, the read/write circuit 250 may receive the data to be written in the memory cell array 210 from a buffer (not illustrated), and may drive the bit lines according to the input data. To this end, the read/write circuit 250 may include a plurality of page buffers (PB) 251 corresponding to the columns (or the bit lines) or column pairs (or bit line pairs), respectively. A plurality of latches may be included in each of the page buffers 251.

Referring to FIGS. 4A and 5, the operation of the controller 100 may include first and second LDPC decoding steps S510 and S530.

The first LDPC decoding step S510 may include performing a hard decision LDPC decoding operation to data which are read from a memory cell of the memory device 200 according to the hard decision read voltage $V_{HD}$. The first LDPC decoding step S510 may include steps S511, S513 and S515. The read data from the memory cell may be i-th data among n-bit data stored in the memory cell. The variables "n" and "i" may be integers greater than 1.

The second LDPC decoding step S530 may include performing a soft decision LDPC decoding operation to the i-th data when the hard decision LDPC decoding to the i-th data at the first LDPC decoding step S510 finally fails. The second LDPC decoding step S530 may include steps S531, S533 and S535.

At step S511 of the hard decision read step, the controller 100 may read the hard decision read data or the codeword from the memory device 200 according to the hard decision read voltages $V_{HD}$, which voltages may be predetermined. The controller 100 may provide a read command and an address to the memory device 200. The memory device 200 may read the hard decision read data therefrom according to the hard decision read voltages $V_{HD}$ in response to the read command and the address and provide them to the controller 100.

At step S513, the ECC 130 may perform the hard decision LDPC decoding operation as the first LDPC decoding operation. The ECC 130 may perform the hard decision LDPC decoding operation to the hard decision read data which are read from the memory device 200 by using the error correction code.

At step S515, the ECC 130 may determine whether the hard decision LDPC decoding operation succeeds or fails. That is, at step S515, it may be determined whether an error of the hard decision read data is corrected. For example, the ECC 130 may determine whether an error of the hard decision read data is corrected by using the hard decision read data, to which the hard decision LDPC decoding is performed at step S513, and a parity check matrix. For example, when the product result of the parity check matrix and the hard decision read data is a zero vector ('0'), it may be determined that the hard decision read data is corrected. On the other hand, when the product result of the parity check matrix and the hard decision read data is not the zero vector ('0'), it may be determined that the hard decision read data is not corrected.

When it is determined that the hard decision LDPC decoding operation of step S513 is successful as the result of the determination of step S515 (S515, Y), read success is obtained (step S520) and the ECC 130 may end the error correction decoding operation. The hard decision read data, to which the hard decision LDPC decoding operation is performed at step S513, may be now the error-corrected data and may be provided externally or used in the controller 100.

When it is determined that the hard decision LDPC decoding operation of step S513 has failed as the result of the determination of step S515 (S515, N), the ECC 130 may perform the second LDPC decoding step S530.

At step S531 of the soft decision read step, the ECC 130 may read data from a memory cell of the memory device 200 according to the soft decision read voltages $V_{SD}$. Further, the ECC 130 may calculate the soft decision read data for the hard decision read data read at step S511 by determining a status of the memory cell.

At step S533, the soft decision LDPC decoding operation may be performed as the second LDPC decoding operation. The soft decision LDPC decoding operation may be performed based on the soft decision read data.

At step S535, it may be determined whether the soft decision LDPC decoding operation succeeds or fails. That is, at step S535, it may be determined whether an error of the soft decision read data, to which the soft decision LDPC decoding operation is performed at step S533, is corrected. For example, the controller 100 may determine whether an error of the soft decision read data is corrected by using the soft decision read data and the parity check matrix. For example, when product result of the parity check matrix and the soft decision read data is the zero vector ('0'), it may be determined that the soft decision read data is corrected. On the other hand, when product result of the parity check matrix and the soft decision read data is not the zero vector ('0'), it may be determined that the soft decision read data, to which the soft decision LDPC decoding operation is performed, is not corrected.

The product process of the parity check matrix and the hard decision read data during the first LDPC decoding step S510 may be the same as the product process of the parity check matrix and the soft decision read data during the second LDPC decoding step S530.

When it is determined that the soft decision LDPC decoding of step S533 is successful as the result of the determination of step S535 (S535, Y), it may be determined at step S520 that the read operation according to soft decision read voltages $V_{SD}$ at step S531 is successful and the error correction decoding operation may end. The soft decision read data, to which the soft decision LDPC decoding operation is performed at step S533, may be now the error-corrected data and may be provided externally or used in the controller 100.

When it is determined that the soft decision LDPC decoding operation of step S533 has failed as the result of determination of step S535 (S535, N), it may be determined at step S540 that the process of step S531 finally fails and the error correction decoding operation may end.

Figure 6A:
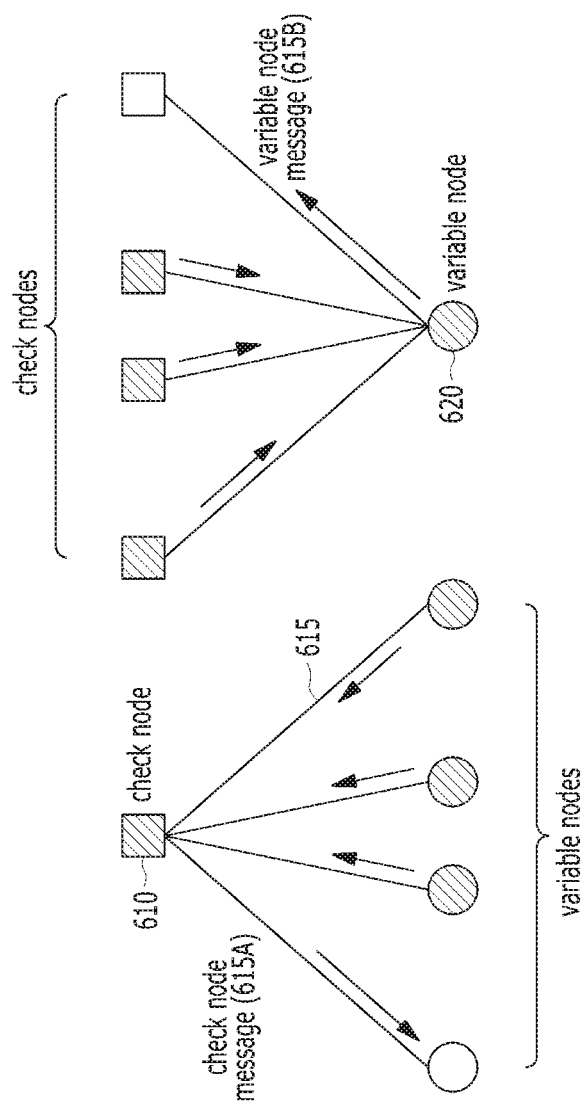
FIG. 6A is a Tanner graph illustrating a low-density parity-check (LDPC) decoding operation.

FIG. 6A is a Tanner graph illustrating a low-density parity-check (LDPC) decoding operation.

Figures 6B, 6C:
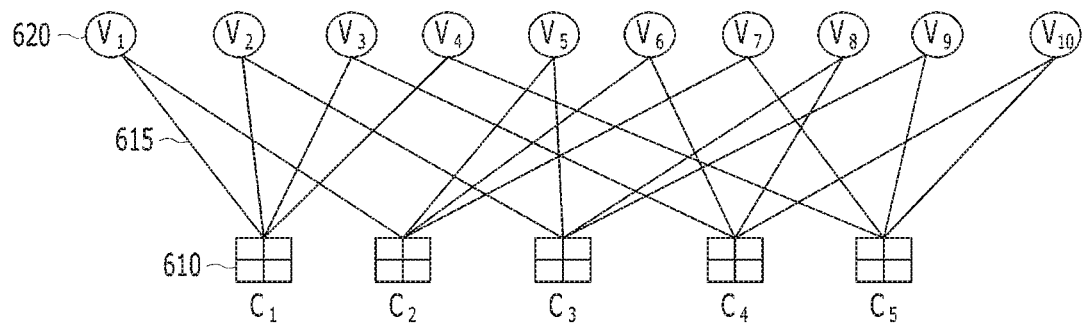
FIG. 6B is a schematic diagram illustrating an LDPC code.
FIG. 6C is a schematic diagram illustrating a syndrome check process according to an LDPC decoding operation.

FIG. 6B is a schematic diagram illustrating an LDPC code.

FIG. 6C is a schematic diagram illustrating a syndrome check process according to the LDPC decoding operation.

An error correction code (ECC) is commonly used in storage systems. Various physical phenomena occurring in storage devices result in noise effects that corrupt the stored information. Error correction coding schemes may be used for protecting the stored information against the resulting errors. This is done by encoding the information before storing the information in the memory device. The encoding process transforms the information bit sequence into a codeword by adding redundancy to the information. This redundancy may then be used in order to recover the information from the possibly corrupted codeword through a decoding process.

In iterative coding schemes, the code is constructed as a concatenation of several simple constituent codes and is decoded based on an iterative decoding algorithm by exchanging information between decoders receiving the simple constituent codes. Usually, the code may be defined using a bipartite graph or a Tanner graph describing interconnections between the constituent codes. In this case, the decoding operation may be viewed as an iterative message passing over the graph edges.

The iterative codes may include the low-density parity-check (LDPC) code. The LDPC code is a linear binary block code defined by a sparse parity-check matrix H.

Referring to FIG. 6A, the LDPC code has a parity check matrix in which the number of logic high levels (i.e., "1s") in each row and column is very small. The structure of the LDPC code may be defined by the Tanner graph including check nodes 610, variable nodes 620, and edges 615 connecting the check nodes 610 to the variable nodes 620. A value delivered from one of the check nodes 610 to one of the variable nodes 620 after check node processing becomes a check node message 615A. A value delivered from one of the variable nodes 620 to one of the check nodes 610 after variable node processing becomes a variable node message 615B.

An initial value of each of the variable nodes 620 may be one of the hard decision read data and the soft decision read data.

A decoding process of the LDPC code may be performed by iterative decoding based on a 'sum-product' algorithm. A decoding method may be provided based on a suboptimal message-passing algorithm such as a 'min-sum' algorithm, which is a simplified version of the sum-product algorithm.

Referring to FIG. 6B, the Tanner graph of the LDPC code may include 5 check nodes 610 (C1 to C5) representing parity check equations of the LDPC code, 10 variable nodes 620 (V1 to V10) representing code symbols, and edges 615 representing relationships between the check nodes 610 and the variable nodes 620. The edges 615 connect each of the check nodes 610 to each of the variable nodes 620 corresponding to a code symbol included in the parity check equations represented by the check nodes 610. FIG. 6B exemplarily illustrates a regular LDPC code in which the number of variable nodes 620 coupled to each of the check nodes 610 is fixed at 4 and the number of the check nodes 610 coupled to each of the variable nodes 620 is fixed at 2.

FIG. 6C shows a parity check matrix H corresponding to the Tanner graph. The parity check matrix H is similar to the graphic expression of the parity check equations. The parity check matrix H has the same number of logic high values (i.e., 1s) in each column. That is, each column of the parity check matrix H has two 1s corresponding to the connections between each of the variable nodes 620 and the check nodes 610. The parity check matrix H has the same number of 1s in each row, that is, each row has four 1s corresponding to the connections between each of the check nodes 610 and the variable nodes 620.

A process of decoding the LDPC code is performed by iterating a process of exchanging messages, which are generated and updated in each node, between the variable nodes 620 and the check nodes 610 in the Tanner graph. In this case, each node updates the messages based on the sum-product algorithm or a similar suboptimal algorithm.

For example, the LDPC decoding operation on the codeword may comprise a plurality of iterations, each of which includes a check nodes update, a variable nodes update and a syndrome check after an initial variable nodes update. After a first iteration, when the result of the syndrome check satisfies a predetermined or set condition, the LDPC decoding operation may end. When the result of the syndrome check does not satisfy the condition, an additional iteration may be performed. The additional iteration may also include the variable node update, the check node update and the syndrome check. The number of iterations may be limited to a maximum iteration count, which may be predetermined. When the result of the syndrome check does not satisfy the condition until the number of iterations reaches the maximum iteration count, the LDPC decoding operation, i.e., the LDPC decoding operation on the codeword may be determined to have failed in LDPC decoding operation.

Referring to FIG. 6C, the syndrome check is a process of identifying whether the product result "H$\underline{v}^t$" of the parity check matrix H and a vector "$\underline{v}$", which is obtained by the update of the variable nodes 620, satisfies the condition. When the product result "H$\underline{v}^t$" becomes the zero vector, the product result "H$\underline{v}^t$" may be evaluated to satisfy the condition.

FIG. 6C shows the syndrome check process. FIG. 6C exemplarily shows a non-zero vector "01100" as the product result "H$\underline{v}^t$", and thus FIG. 6C shows that the syndrome check does not satisfy the condition and another iteration should be performed.

Figure 7A:
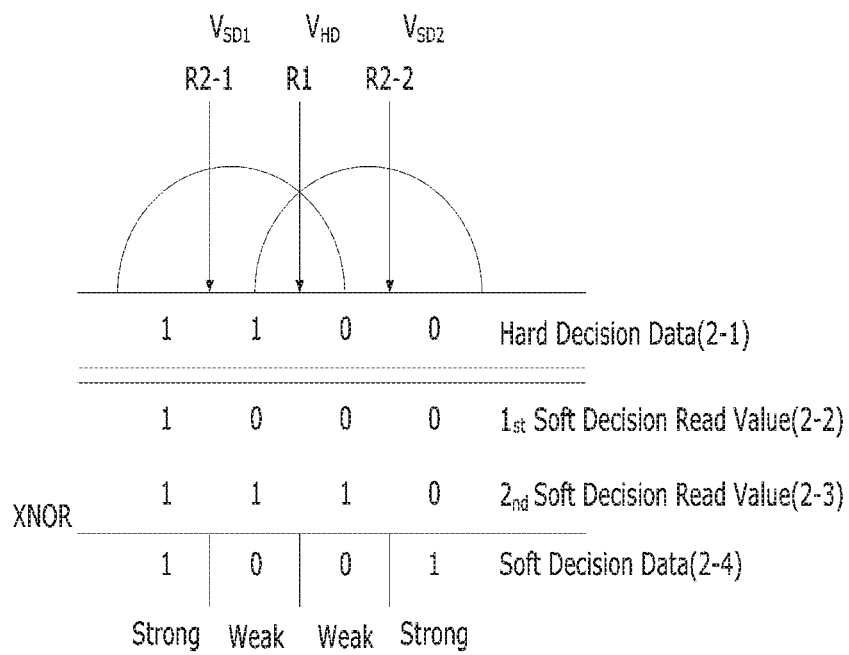
FIG. 7A is a diagram illustrating a 2-bit soft decision read operation in accordance with an embodiment of the present disclosure.
Figure 7B:
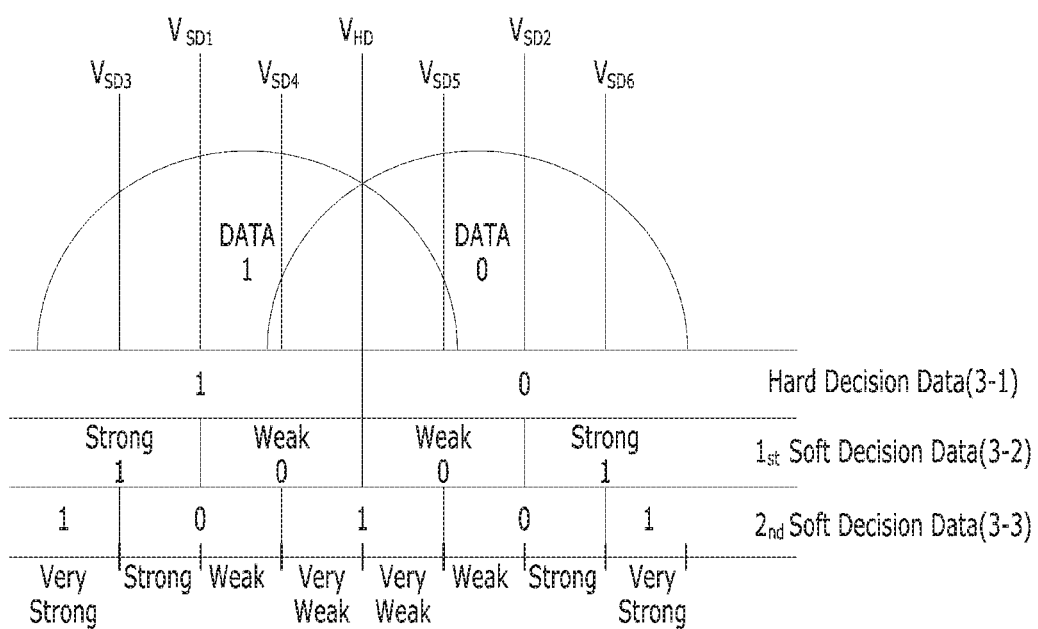
FIG. 7B is a diagram illustrating a 3-bit soft decision read operation in accordance with an embodiment of the present disclosure.

FIG. 7A is a diagram illustrating the 2-bits soft decision read operation in accordance with an embodiment of the present disclosure. FIG. 7B is a diagram illustrating the 3-bits soft decision read operation in accordance with an embodiment of the present disclosure. The soft decision read operations of FIGS. 7A and 7B may be performed by the operation of FIG. 5.

Referring to FIG. 7A, at the hard decision LDPC decoding step S510 of FIG. 5, the hard decision data 2-1 may have a value of 1 or 0 depending on the on-off state of the memory cell when the hard decision read voltage $V_{HD}$ is applied to the memory cell of the memory device 200.

At the soft decision LDPC decoding step S530, the ECC 130 may calculate reliability information (e.g., log-likelihood ratio (LLR)) for hard decision read data through the soft decision read operation, which applies a plurality of soft decision read voltages $V_{SD1}$, $V_{SD2}$ having constant voltage difference to the memory cell based on the hard decision read voltage $V_{HD}$.

As illustrated in FIG. 7A, in the 2-bits soft decision read operation, the soft decision read data value 2-2 is '1000' depending on the on-off state of the memory cell when the first decision read voltage $V_{SD1}$ is applied to the memory cell. Similarly, the second soft decision read data 2-3 is '1110' depending on the second soft decision read voltage $V_{SD2}$.

And, the ECC 130 may calculate the soft decision data 2-4 (e.g., LLR) by performing an exclusive NOR operation on the first soft decision data value 2-2 and second soft decision data value 2-3. The soft decision data 2-4 may add reliability to the hard decision data 2-1.

For example, when the soft decision data 2-4 is '1', the hard decision data 2-1 may be a first state (e.g., '1') or a second state (e.g., '0') with a strong probability. On the other hand, when the soft decision data 2-4 is '0', the hard decision data 2-1 may be a first state (e.g., '1') or a second state (e.g., '0') with a weak probability.

Referring the FIG. 7B, at the hard decision LDPC decoding step S510 of FIG. 5, the hard decision data 3-1 may have a value of 1 or 0 depending on the on-off state of the memory cell when the hard decision read voltage $V_{HD}$ is applied to the memory cell of the memory device 200.

At the soft decision LDPC decoding step S530, the ECC 130 may calculate reliability information (e.g., LLR) for hard decision read data through the soft decision read operation, which applies a plurality of soft decision read voltages $V_{SD1}$ to $V_{SD6}$ having constant voltage difference to the memory cell based on the hard decision read voltage $V_{HD}$.

As illustrated in FIG. 7B, in the 3-bits soft decision read operation, the first and the second soft decision read data value may be calculated when the first soft decision read voltages $V_{SD1}$ and the second soft decision read voltages $V_{SD2}$ is applied to the memory cell. The first soft decision data 3-2 may be calculated as '1001' by performing an exclusive NOR operation on the first and second soft decision read data value.

The third to sixth soft decision read data value may be calculated when the third to sixth soft decision read voltage $V_{SD3}$ to $V_{SD6}$ is applied to the memory cell. The second soft decision data 3-3 (e.g., LLR) may be calculated as '10101' by performing an exclusive NOR operation on the third to sixth soft decision read data value $VS_{D3}$ to $V_{SD6}$. The second soft decision data 3-3 may assign a weight to the first soft decision data 3-2.

For example, when the second soft decision data 3-3 is '1', the first soft decision data 3-2 may be a first state (e.g., '1') with a very strong probability. On the other hand, when the second soft decision data 3-3 is '0', the first soft decision data 3-2 may be the first state (e.g., '1') with a strong probability.

Similarly, when the second soft decision data 3-3 is '1', the first soft decision data 3-2 may be a second state (e.g., '0') with a very weak probability. On the other hand, when the second soft decision data 3-3 is '0', the first soft decision data 3-2 may be the second state (e.g., '1') with a weak probability. That is, similar to that described in FIG. 7A, the second soft decision data 3-3 may add more reliability to the hard decision data 3-1.

As illustrated in FIGS. 6A to 6C, the controller 100 may read reliable data from the memory device 200, using the decoder 133. The LDPC decoding method described with reference to FIGS. 6A to 6C is a decoding technique for each of a plurality of pages included in the memory device 200. The LDPC decoding method described with reference with FIGS. 6A to 6C may sense and correct single-bit errors constituting most memory errors. However, the increase in memory capacity and memory density and the increase in speed of memory sub-systems significantly raise a risk of multi-bit errors. Therefore, there is demand for a technique capable of coping with decoding failure of each page. Hereafter, the technique will be referred as global decoding. Since the global decoding has a function of correcting a multi-bit error, the availability of the memory system may be significantly improved.

Encoding/decoding may be performed on unit data, for example, on a data chunk basis, where each chunk is of a set or predetermined size. In another embodiment, the unit data on which encoding/decoding may be performed may be a page, in which case the encoding/decoding is performed on a page basis. However, these are only an examples; the present invention is not limited thereto.

Figure 8A:
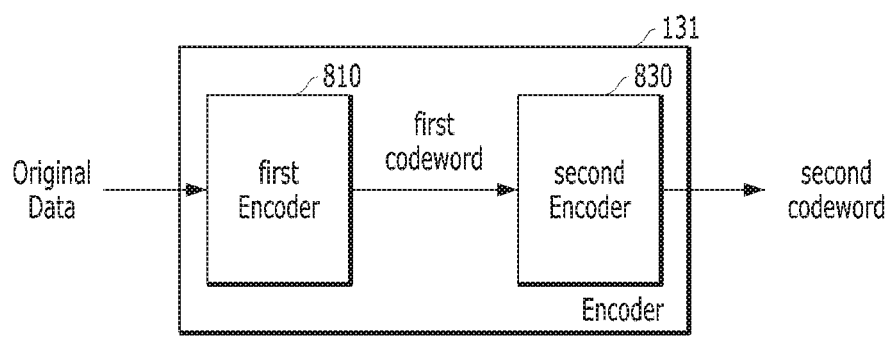
FIG. 8A is a block diagram illustrating a structure of an encoder in accordance with an embodiment of the present disclosure.

FIG. 8A illustrates the structure of an encoder 131 in accordance with an embodiment of the present disclosure.

Referring to FIG. 8A, the encoder 131 may include first and second encoders 810 and 830. As described with reference to FIG. 3, the encoder 131 may receive original data according to control of the CPU 120. The encoder 131 may perform an encoding operation on the received original data, using the LDPC encoding.

The first encoder 810 may receive the original data. The first encoder 810 may perform a first encoding operation on the original data. As described above, the first encoder 810 may perform the first encoding operation on the original data on a set data chunk basis. The size of the data chuck may be set by a designer. For example, the size of the data chunk may correspond to the size of one physical page or the size of a part of one physical page. The first encoding operation will be described in detail with reference to FIG. 8B.

Figure 8B:
FIG. 8B is a diagram illustrating an encoding method in accordance with an embodiment of the present disclosure.

FIG. 8B is a diagram illustrating the encoding method, and more particularly the first encoding operation, in accordance with an embodiment of the present disclosure. In an embodiment, the first encoder 810 encodes data on a set or predetermined data chunk basis. Furthermore, the first encoder 810 may perform the first encoding operation using LDPC codes.

The first encoder 810 may group a plurality of data chunks as a first encoding group. Each of the data chunks may indicate original data provided from the host. For example, as illustrated in FIG. 8B, the first encoder 810 may group first to third data chunks as the first encoding group. Then, the first encoder 810 may perform an XOR operation on the first to third data chunks. As a result, the first encoder 810 may generate a chip-kill chunk corresponding to the first encoding group through the XOR operation. The chip-kill chunk may indicate a parity data chunk corresponding to each of the first to third data chunks.

Referring back to FIG. 8A, the first encoder 810 may perform the first encoding operation on the original data through the same method as described with reference to FIG. 8B. As a result, the first encoder 810 may output a first codeword corresponding to the original data. The first codeword may include the first encoding group and the chip-kill chunk corresponding to the first encoding group. As shown in FIG. 8B, the first codeword may include the first to third data chunks and the chip-kill chunk. The first encoder 810 may provide the first codeword to the second encoder 830.

The second encoder 830 may perform a second encoding operation to add parity data to each of the data chunks included in the first encoding group and the chip-kill chunk, using LDPC codes. As shown in FIG. 8B, the second encoder 830 may perform the second encoding operation to add the parity data to each of the first to third data chunks and the chip-kill chunk. As a result, the second encoder 830 may generate a second codeword based on the first codeword. The second codeword may include the first codeword and the parity data corresponding to the respective data chunks included in the first codeword. The second encoder 830 may output the second codeword.

Figure 8C:
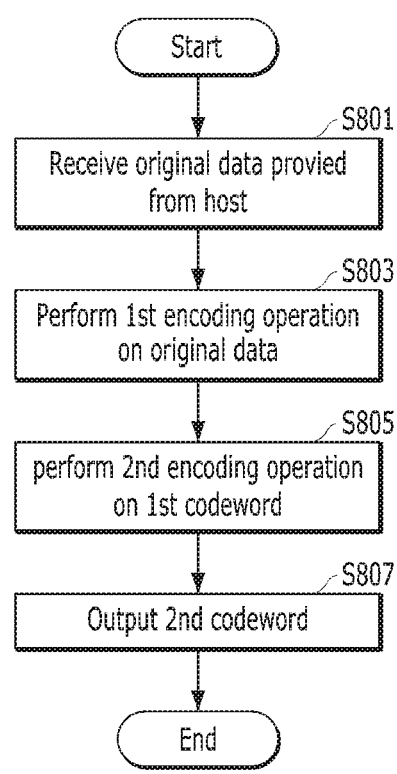
FIG. 8C is a flowchart illustrating an operation of an encoder in accordance with an embodiment of the present disclosure.

FIG. 8C is a flowchart illustrating an operation of an encoder, e.g., the encoder 131 of FIG. 8A, in accordance with an embodiment of the present disclosure.

Referring to FIG. 8C, the encoder 131 may receive original data provided from the host according to control of the CPU 120 at step S801. The received original data may be inputted to the first encoder 810.

At step S803, the first encoder 810 may perform a first encoding operation on the original data. The first encoder 810 may encode the original data on a set data chunk basis through the first encoding operation. As a result, the first encoder 810 may generate a first codeword including a first encoding group and a chip-kill chunk corresponding to the first encoding group. The first encoder 810 may provide the first codeword to the second encoder 830.

At step S805, the second encoder 830 may perform a second encoding operation on the first codeword. Like the first encoder 810, the second encoder 830 may also perform the second encoding operation on a set data chunk basis. Further, the second encoder 830 may generate a second codeword by adding parity data to the first codeword. The parity data may be corresponding to the first encoding group and the chip-kill chunk which are included in the first codeword.

At step S807, the second encoder 830 may output the second codeword. Furthermore, although not illustrated, the outputted second codeword may be stored in the memory device 200 according to control of the CPU 120. However, the second codeword may be stored in the memory device 200 in different ways depending on the sizes of data chunks. Specifically, the method for storing the second codeword will be described with reference to FIGS. 9A to 9C.

Figure 9A:
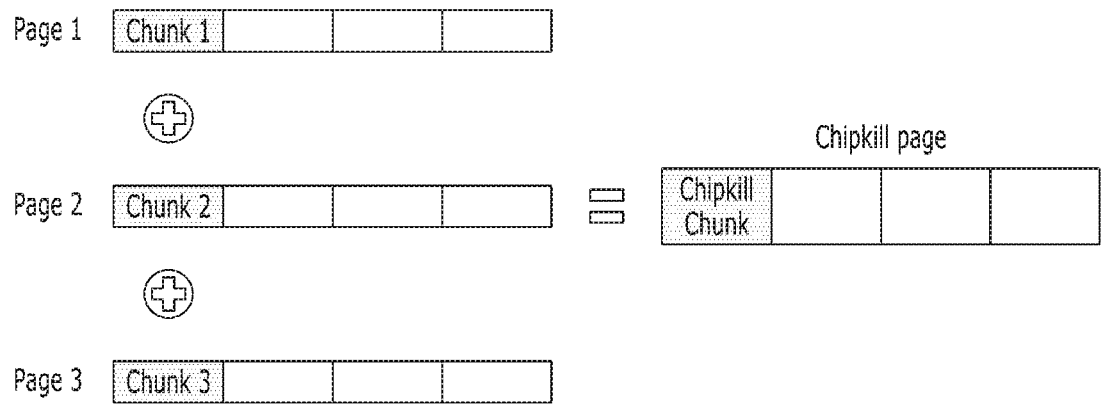
FIGS. 9A to 9C are diagrams illustrating a method for storing a second codeword in accordance with an embodiment of the present disclosure.
Figure 9B:
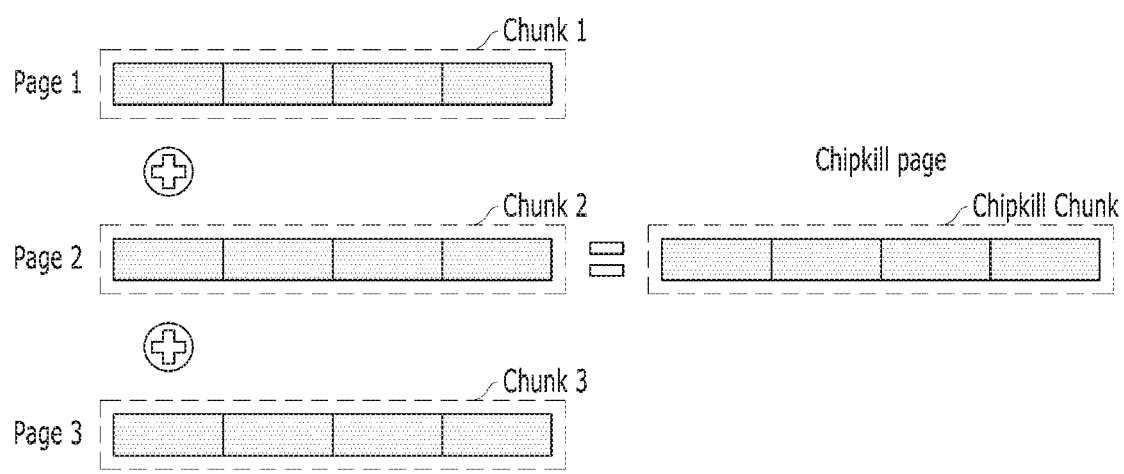
Figure 9C:
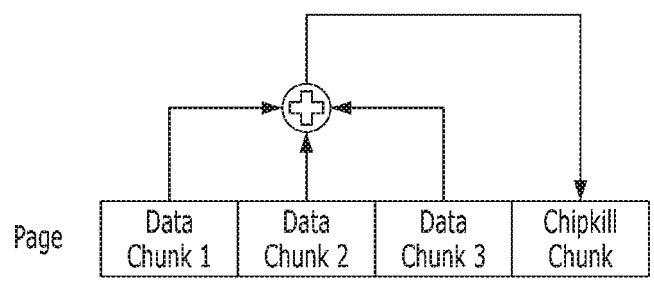

FIGS. 9A to 9C are diagrams illustrating a method for storing a second codeword in accordance with an embodiment of the present disclosure. Specifically, a method for storing the second codeword depending on the sizes of data chunks will be described. Referring to FIG. 8B, a method for storing the first to third data chunks and the chip-kill chunk will be described.

In FIG. 9A, each of the data chunks may correspond to an ECC chunk unit. Furthermore, in this embodiment the ECC chunk unit is equal to '¼' of one physical page. However, this is only an example; the present invention is not limited thereto.

In this case, since the size of each of the first to third data chunks and the chip-kill chunk is equal to '¼' of one physical page, the data chunks may be stored in parts of a plurality of pages, respectively. For example, the first data chunk may be stored in a part of a first page, the second data chunk may be stored in a part of a second page, the third data chunk may be stored in a part of a third page, and the chip-kill chunk may be stored in a part of a chip-kill page. The chip-kill page may indicate a page in which only the chip-kill chunk is stored. The first to third pages and the chip-kill page are different pages which are present in the same super block. As illustrated in FIG. 9A, the result of an XOR operation on the first to third data chunks is equal to the chip-kill chunk. Furthermore, although not illustrated in the drawing, each of the data chunks may include parity data generated through the second encoding operation.

FIG. 9B is based on the supposition that each of the data chunks is equal to the size of one physical page. However, this is only an example; the present invention is not limited thereto.

In this case, since the size of each of the first to third data chunks and the chip-kill chunk correspond to the size of one physical page, the data chunks may be stored in the respective pages. For example, the first data chunk may be stored in the first page, the second data chunk may be stored in the second page, the third data chunk may be stored in the third page, and the chip-kill chunk may be stored in the chip-kill page. The first to third pages and the chip-kill page are different pages which are present in the same super block. As illustrated in FIG. 9B, the result of an XOR operation on the first to third data chunks is equal to the chip-kill chunk. Furthermore, although not illustrated in the drawing, each of the data chunks may include parity data generated through the second encoding operation.

FIG. 9C is based on the supposition that each of the data chunks corresponds to an ECC chunk unit and the ECC chunk unit is equal to '¼' of one physical page, similar to FIG. 9A.

However, the plurality of data chunks of FIG. 9C may be stored in one page in a different manner from the method described with reference to FIG. 9A. For example, as illustrated in FIG. 9C, the first to third data chunks and the chip-kill chunk may be stored in one physical page. The result of an XOR operation on the first to third data chunks is equal to the chip-kill chunk. Furthermore, although not illustrated the drawing, each of the data chunks may include parity data generated through the second encoding operation.

Operation of the decoder 133 to decode data (i.e., second codeword) encoded by the encoder 131 in accordance with an embodiment of the present disclosure will be described.

Although not illustrated in the drawings, the CPU 120 of FIG. 4A may load data corresponding to a read request of the host from the memory device 200, based on a set read unit. Hereafter, the data will be referred to as a target data chunk. For example, when the read unit corresponds to a unit of page, the CPU 120 may read the target data chunk on a page basis. For another example, when the read unit corresponds to '¼' of one page, the CPU 120 may read the target data chunk on a basis of '¼' page. However, this is only an example; the present invention is not limited thereto. The CPU 120 may input the loaded target data chunk to the decoder 133 in order to determine whether the target data chunk has an error.

Figure 10:
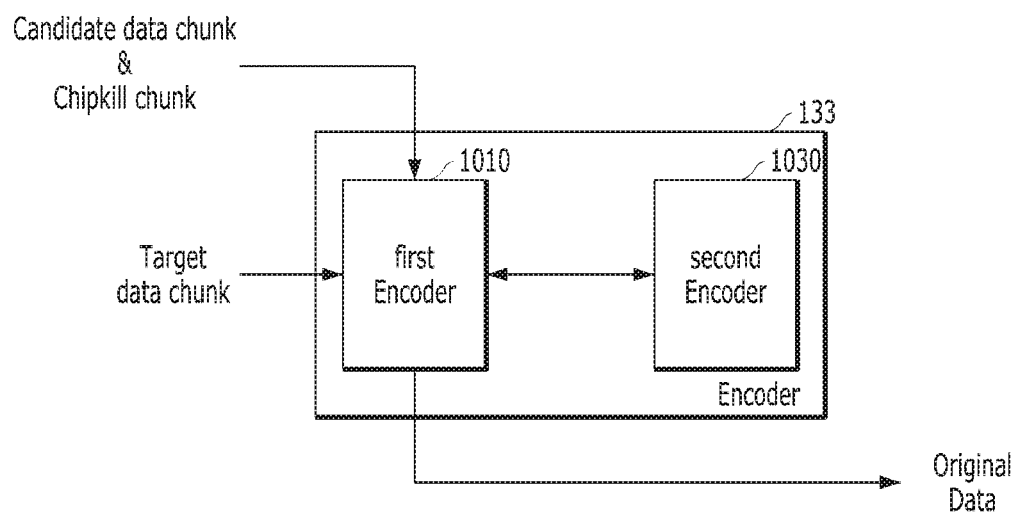
FIG. 10 is a diagram schematically illustrating a structure of a decoder in accordance with an embodiment of the present disclosure.

FIG. 10 schematically illustrates the structure of a decoder, e.g., the decoder 133 of FIG. 3, in accordance with an embodiment of the present disclosure.

Referring to FIG. 10, the decoder 133 may receive the target data chunk according to control of the CPU 120 of FIG. 4A. As described with reference to FIGS. 8A to 9C, the data stored in the memory device 200 is the second codeword described with reference to FIG. 8A.

The decoder 133 may perform a decoding operation using LDPC codes. The decoder 133 may perform the decoding operation on a set data chunk basis which is utilized in the encoder 131 of FIG. 3. Therefore, when the encoder 131 performs an encoding operation on a data chunk having the same size as one physical page, the decoder 133 may also perform a decoding operation on a data chunk having the same size as one physical page.

Specifically, the decoder 133 may include a first decoder 1010 and a second decoder 1030. The first decoder 1010 may perform a first sub-decoding operation on the target data chunk. The first decoder 1010 may decode the target data chunk based on the parity data generated through the second encoding operation. That is, as described with reference to FIGS. 6A to 6C, the first decoder 1010 may perform the first sub-decoding operation based on the parity data corresponding to the target data chunk.

When having succeeded in the first sub-decoding operation, the first decoder 1010 may immediately output the target data chunk according to control of the CPU 120.

On the other hand, when having failed in the first sub-decoding operation, the first decoder 1010 may receive candidate data chunks and a chip-kill chunk which are stored in the memory device 150, according to control of the CPU 120. The candidate data chunks may indicate a plurality of data chunks constituting the first encoding group with the target data chunk, when the first encoding operation is performed. The chip-kill chunk may indicate a chip-kill chunk generated from the first encoding group when the first encoding operation is performed.

The first decoder 1010 may perform a second sub-decoding operation on the candidate data chunks and the chip-kill chunk. That is, as described with reference to FIGS. 6A to 6C, the first decoder 1010 may perform the second sub-decoding operation based on the parity data corresponding to the respective data chunks.

When the second sub-decoding operation on the candidate data chunks and the chip-kill chunk succeeded, the first decoder 1010 may infer the target data chunk from the candidate data chunks and the chip-kill chunk, based on an XOR operation.

When the second sub-decoding operation on the candidate data chunks and the chip-kill chunk failed, the second decoder 1010 may set all components of a global check node to '0' as will be described below.

On the other hand, when having failed in the second sub-decoding operation on one or more data chunks, the first decoder 1010 may provide the target data chunk, the candidate data chunks and the chip-kill chunk to the second decoder 1030.

The second decoder 1030 may perform third and fourth sub-decoding operations based on the target data chunk, the candidate data chunks and the chip-kill chunk.

The structure and operation process of the second decoder 1030 will be described in detail with reference to FIGS. 11 to 13E.

Figure 11:
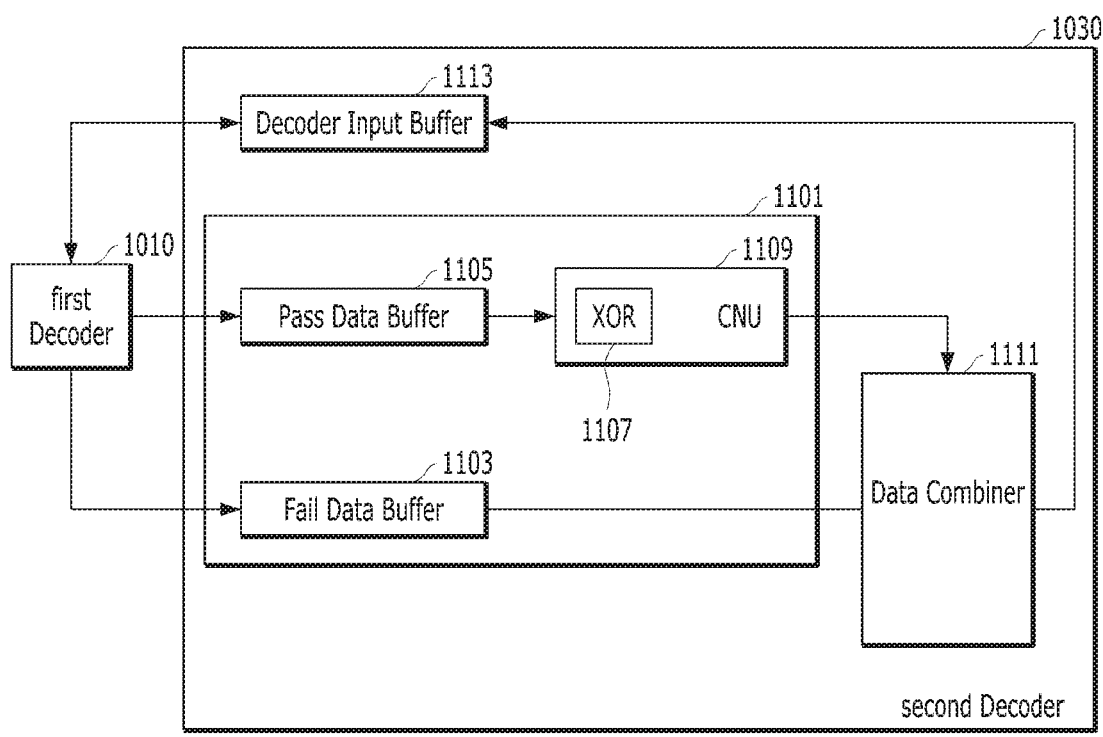
FIG. 11 is a diagram illustrating a structure of a second decoder in accordance with an embodiment of the present disclosure.

FIG. 11 illustrates the structure of a second decoder, e.g., the second decoder 1030 of FIG. 10, in accordance with an embodiment of the present disclosure.

Referring to FIG. 11, the second decoder 1030 may include a global check node component 1101, a data combiner 1111 and a decoder input buffer 1113. The following description is given in the context that the first sub-decoding operation on the target data chunk failed.

The global check node component 1101 may include a fail data buffer 1103, a pass data buffer 1105, an exclusive OR (XOR) unit 1107 and a check node unit (CNU) 1109. The global check node component 1101 may perform a third sub-decoding operation based on a data chunk on which a second sub-decoding operation succeeded (hereafter, referred to as success data chunk) and a data chunk on which the second sub-decoding operation failed (hereafter, referred to as fail data chunk).

Specifically, information of the success data chunk (for example, components of local variable nodes corresponding to the success data chunk) may be stored in the pass data buffer 1105, and information of the fail data chunk (for example, components of local variable nodes corresponding to the fail data chunk) may be stored in the fail data buffer 1103. Furthermore, since the first sub-decoding operation on the information of the target data chunk also failed, the information of the target data chunk may also be stored in the fail data buffer 1103 with the information of the fail data chunk. Furthermore, the information of the target data chunk, the information of the success data chunk and the information of the fail data chunk may be stored in the decoder input buffer 1113.

The XOR unit 1107 may perform an XOR operation on local variable nodes of the success data chunk. The result of the XOR operation performed by the XOR unit 1107 may be transferred to the CNU 1109. The CNU 1109 may generate a global check node based on the result of the XOR operation.

The data combiner 1111 may perform a fourth sub-decoding operation. The fourth sub-decoding operation may include an operation of inferring and updating local variable nodes of the target data chunk and the fail data chunk from the global check node.

Specifically, the data combiner 1111 may infer the local variable nodes of the target data chunk and the fail data chunk by utilizing the global check node received from the CNU 1109 and the target data chunk information and the fail data chunk information which are received from the fail data buffer 1103. Furthermore, the data combiner 1111 may transfer components of the inferred local variable nodes to the decoder input buffer 1113.

The decoder input buffer 1113 may update the components of the local variable nodes of the target data chunk and the fail data chunk which are stored therein, based on the components of the local variable nodes of the target data chunk and the fail data chunk which are received from the data combiner 1111. Then, the decoder input buffer 1113 may transfer the updated components to the first decoder 1010.

The decoder 133 of FIG. 10 may perform the first sub-decoding operation again, based on the updated components. The decoder 133 may perform a repeating operation of repeating the first to fourth sub-decoding operations once by a set number of times.

When the first sub-decoding operation on the target data chunk succeeded, the decoder 133 may output the target data chunk to the outside.

The operation of the second decoder 1030 in accordance with an embodiment of the present disclosure will be described in more detail with reference to FIGS. 12 to 13E.

Figure 12:
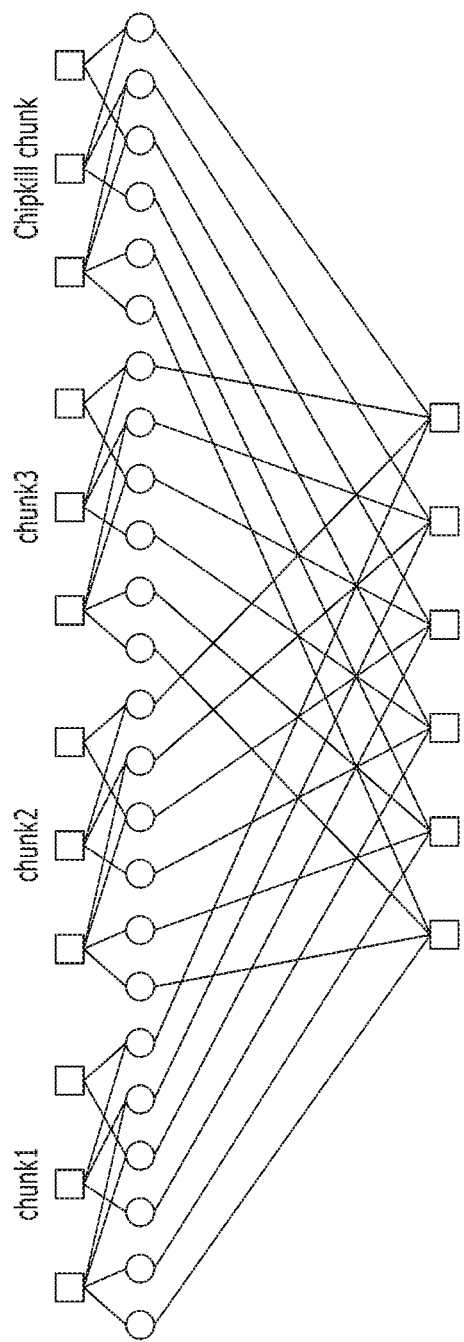
FIG. 12 is a diagram illustrating a structure of global decoding in accordance with an embodiment.

FIG. 12 is a diagram illustrating the structure of global decoding in accordance with an embodiment.

When the first sub-decoding operation on the target data chunk chunk1 failed, the first decoder 1010 of the decoder 133 in FIG. 10 may perform the second sub-decoding operation on the candidate data chunks chunk2 and chunk3 and the chip-kill chunk.

Based on the results of the first and second sub-decoding operations, local variable nodes corresponding to the respective data chunks may be generated. For example, as illustrated in FIG. 12, each of the first to third data chunks chunk1 to chunk3 and the chip-kill chunk may include three local check nodes, six local variable nodes, and edges connecting the local check nodes to the local variable nodes, as shown in FIG. 12. The first decoder 1010 may update the logic values of the respective nodes using the sum-product algorithm or an optimal method equivalent to the sum-product algorithm on the respective nodes. The logic values of the respective nodes will be referred to as components.

The first decoder 1010 may perform a plurality of repetitions each including updating the local check nodes, updating the local variable nodes, and performing syndrome check. Further, the first decoder 1010 may determine whether the first and second sub-decoding operations on each of the first to third data chunks and the chip-kill chunk succeeded or failed.

When the second sub-decoding operation on one or more data chunks failed, the first decoder 1010 may provide the target data chunk, the candidate data chunks and the chip-kill chunk to the second decoder 1030.

The second decoder 1030 may perform the third sub-decoding operation on a data chunk on which the second sub-decoding operation succeeded, among the second and third data chunks and the chip-kill chunk.

Specifically, the second decoder 1030 may perform an XOR operation on the updated components of the local variable nodes of the success data chunk. For example, when there are a plurality of success data chunks, the decoder 133 may perform an XOR operation on the components of first local variable nodes corresponding to the respective success data chunks. According to the same principle, the second decoder 1030 may perform an XOR operation on the components of second to sixth local variable nodes. As the result of the XOR operations, a global check node having two kinds of components, i.e., values of 0 and 1 may be generated. That is, the global check node including first to sixth global check nodes may be generated as the results obtained by performing the XOR operations on the components of the first to sixth local variable nodes corresponding to the success data chunk, respectively. The local variable nodes may be updated in different ways, depending on the components of the global check node.

However, when the second sub-decoding operation on all of the data chunks failed, all of the components of the global check node may be set to '0'. On the other hand, when the second sub-decoding operation on all of the data chunks succeeded, the global decoding may not be performed.

Then, the second decoder 1030 may perform the fourth sub-decoding operation to infer local variable nodes of the target data chunk and the fail data chunk, based on the global check node.

Furthermore, when the components of the local variable nodes of the existing target data chunk and the existing fail data chunk are different from the messages of the local variable nodes of the target data chunk and the fail data chunk which are inferred through the fourth sub-decoding operation, the second decoder 1030 may newly update the components of the local variable nodes of the target data chunk and the fail data chunk.

After the fourth sub-decoding operation is performed, the decoder 133 may perform a repeating operation of repeating the first to fourth sub-decoding operations once by a set number of times.

For example, when there are two or more fail data chunks on which the second sub-decoding operation failed, the decoder 133 may perform the fourth sub-decoding operation based on the global check node generated through the third sub-decoding operation, and repeat the first to fourth sub-decoding operations whenever the components of the local variable nodes of the target data chunk and the fail data chunk which are inferred through the fourth sub-decoding operation are additionally updated. Whenever the repeating operation is performed, a success data chunk may be additionally generated, and the components of the global check node may be newly changed. Thus, the scale of the global decoding may be gradually reduced.

When the first sub-decoding operation on the target data succeeds through the set number of repeating operations, the decoder 133 may output the target data chunk.

FIGS. 13A to 13E are a flowchart and diagrams illustrating the operation process of a decoder, e.g., the decoder 133 of FIG. 10, in accordance with an embodiment.

Figure 13A:
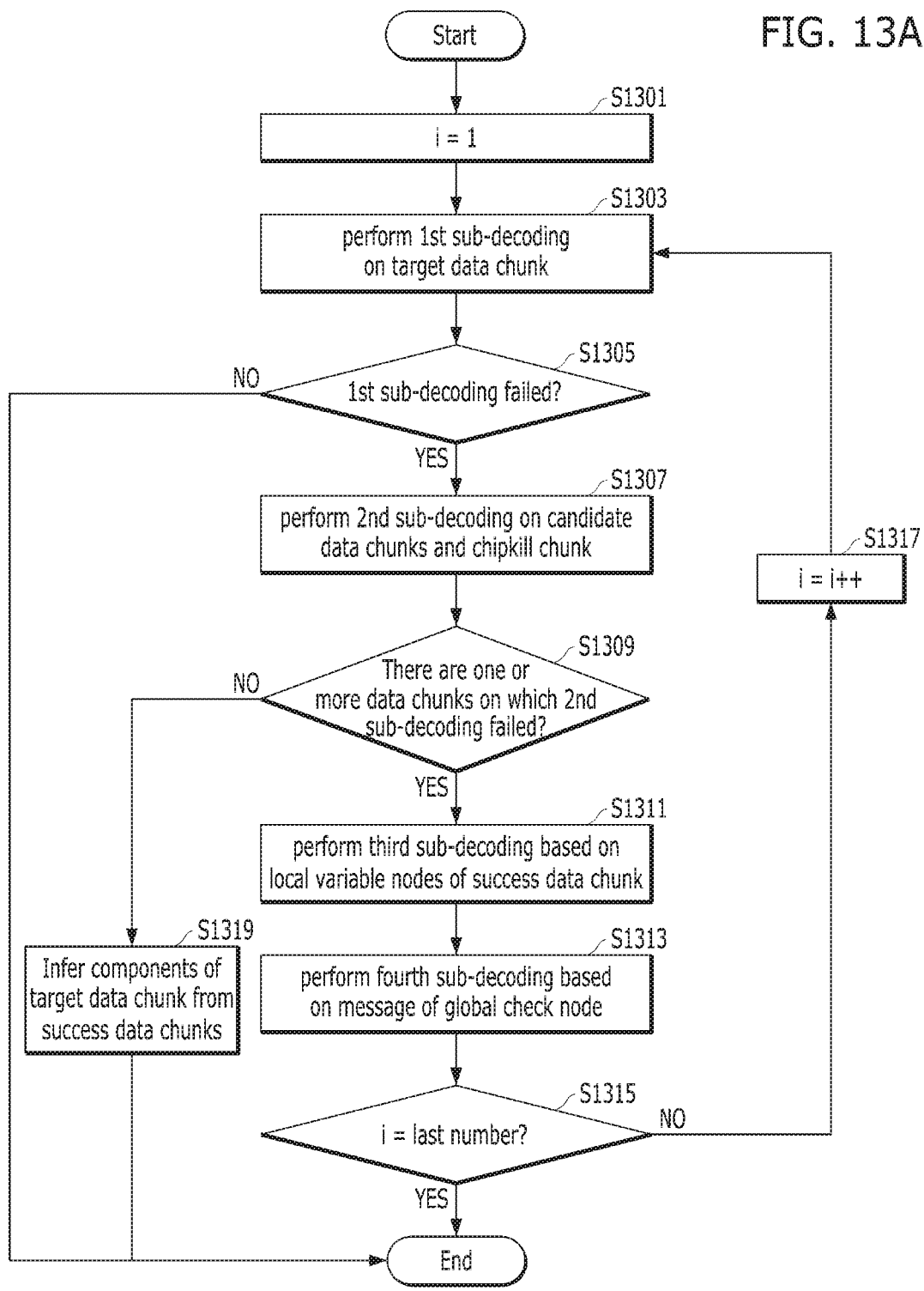
FIG. 13A is a flowchart illustrating a decoding process in accordance with an embodiment of the present disclosure.

FIG. 13A is a flowchart illustrating the decoding process in accordance with an embodiment of the present disclosure, and FIGS. 13B to 13E are diagrams illustrating a specific example of the decoding process in accordance with an embodiment of the present disclosure.

Referring to FIG. 13A, at step S1301, the decoder 133 of FIG. 10 may reset the number i of repeating operations described with reference to FIG. 12.

At step S1303, the decoder 133 may perform the first sub-decoding operation on the target data chunk.

At step S1305, the decoder 133 may determine whether the first sub-decoding operation failed. When the first sub-decoding operation succeeded ('No' at step S1305), the decoder 133 may immediately output the target data chunk.

When the first sub-decoding operation failed ('Yes' at step S1305), the decoder 133 may perform the second sub-decoding operation on each of the candidate data chunks and the chip-kill chunk at step S1307.

Figure 13B:
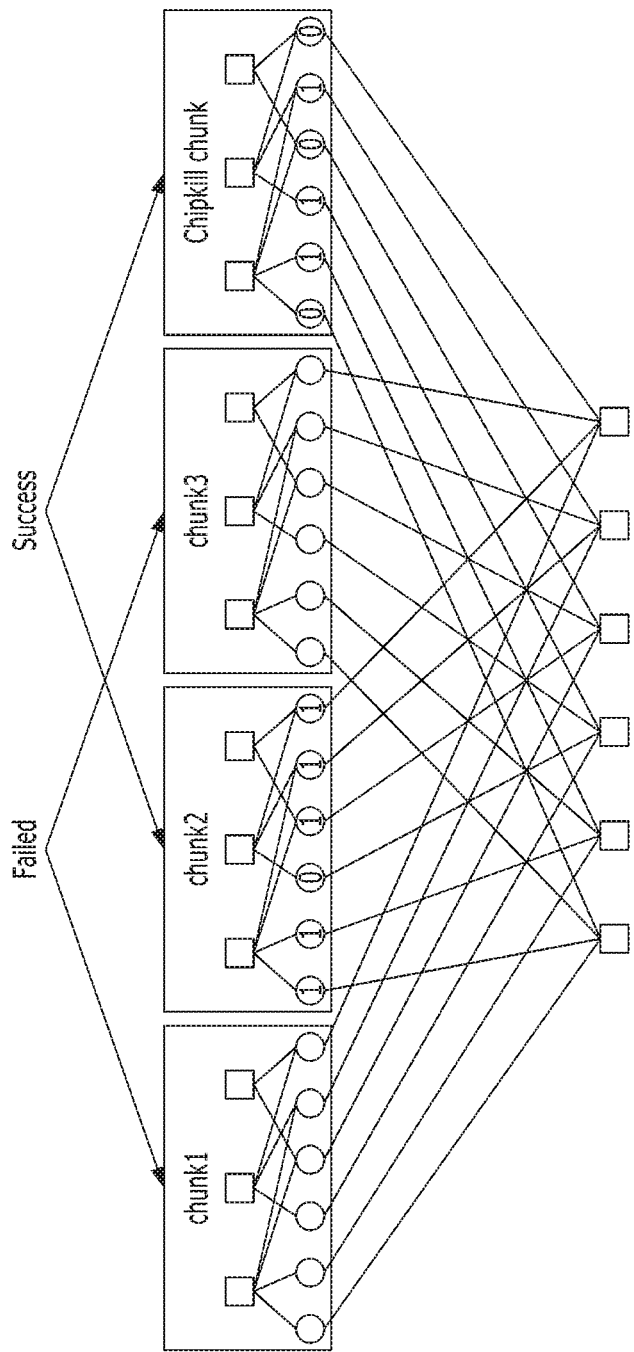
FIGS. 13B to 13E are diagrams illustrating examples of a decoding process in accordance with an embodiment of the present disclosure.

For example, as illustrated in FIG. 13B, the decoder 133 may perform the first and second sub-decoding operations on each of the first to third data chunks and the chip-kill chunk. The decoder 133 may confirm that the first and third data chunks are fail data chunks, and the second data chunk and the chip-kill chunk are success data chunks. Furthermore, the decoder 133 may update the components of the local variable nodes of the second data chunk into '1', '1', '0', '1', '1' and '1', and update the components of the local variable nodes of the chip-kill chunk into '0', '1', '1', '0', '1' and '0', as the result of the second sub-decoding operation.

Referring back to FIG. 13A, when there are one or more data chunks on which the second sub-decoding operation failed ('Yes' at step S1309), the decoder 133 may perform the third sub-decoding operation to generate a global check node from the local variable nodes of the success data chunks through an XOR operation at step S1311.

Figure 13C:
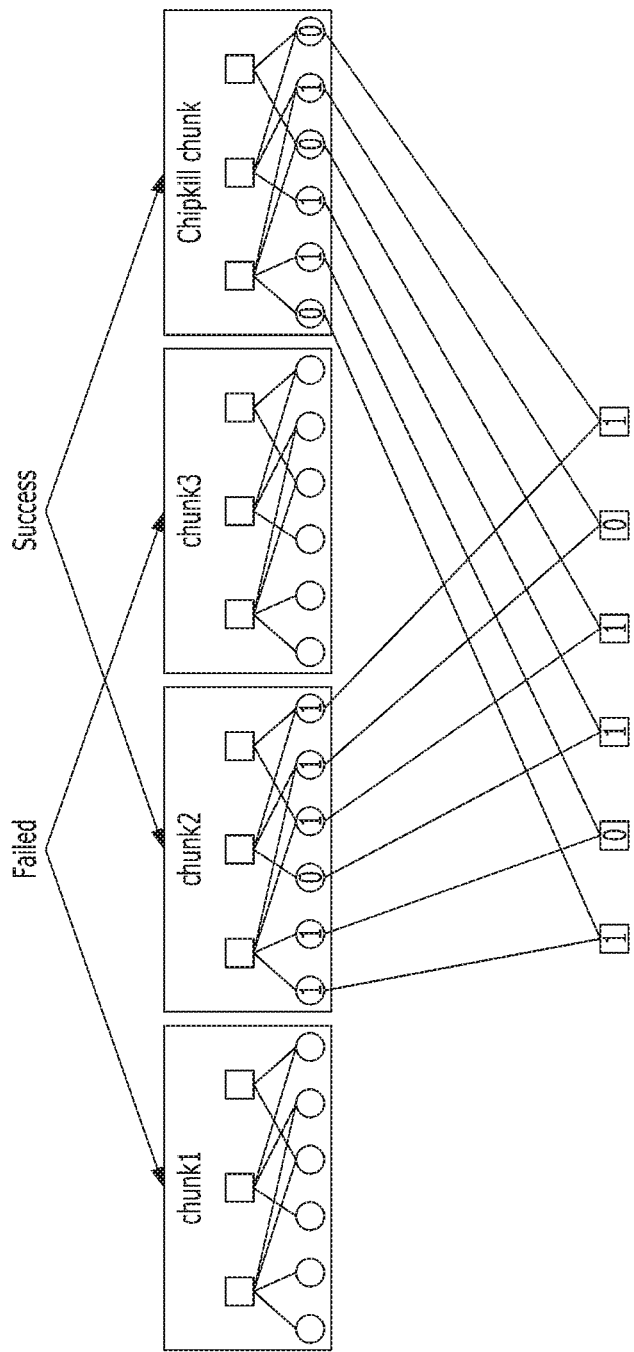

For example, as illustrated in FIG. 13C, the decoder 133 may generate the global check node from the local variable nodes of the second data chunk and the chip-kill chunk which are the success data chucks, through an XOR operation.

Specifically, the decoder 133 may generate the component '1' of the first global check node by performing an XOR operation on '1' and '0' which are the components of the first local variable nodes of the second data chunk and the chip-kill chunk. According to the same principle, the decoder 133 may generate the components '1', '0', '1', '1', '0' and '1' of the second to sixth global check nodes by performing XOR operations on the components of the second to sixth local variable nodes of the second data chunk and the chip-kill chunk, respectively.

Referring back to FIG. 13A, at step S1313, the decoder 133 may perform the fourth sub-decoding operation of inferring and updating the components of the local variable nodes of the target data chunk and the fail data chunk from the generated global check node.

The decoder 133 may infer the components of the local variable nodes of the target data chunk and the fail data chunk using the min-sum algorithm. The decoder 133 may update the local variable nodes of the target data chunk and the fail data chunk to reflect the inferred components.

Figure 13D:
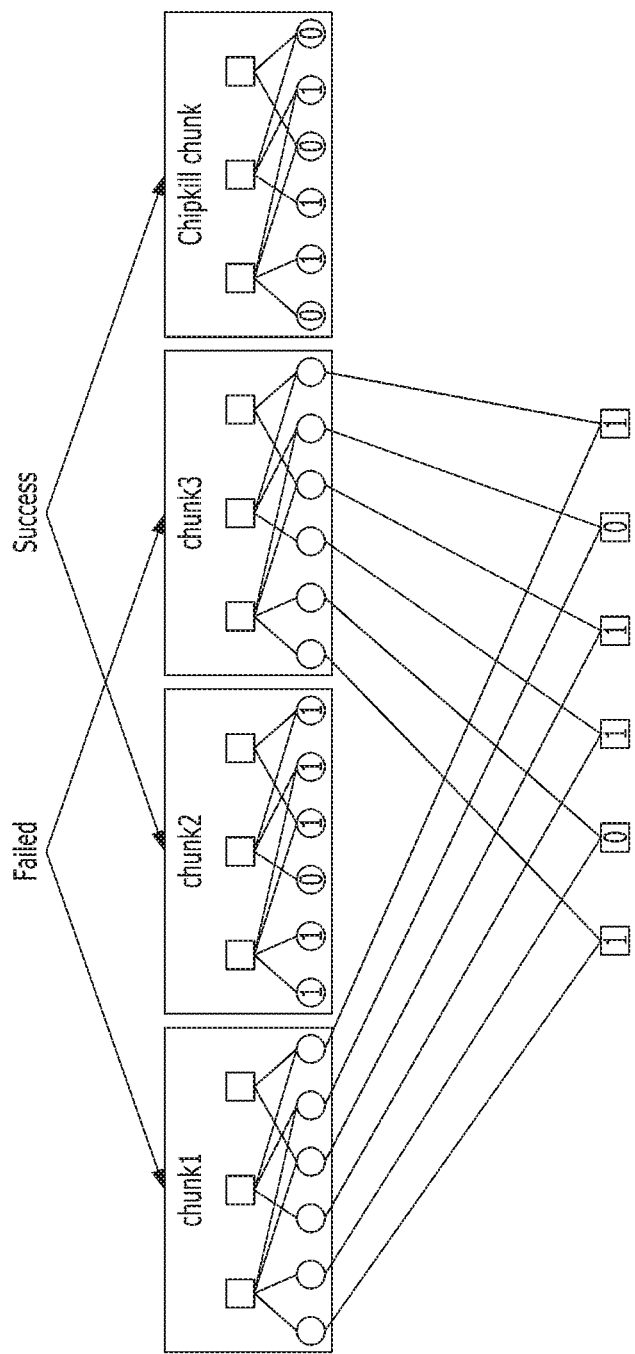

That is, as illustrated in FIG. 13D, the decoder 133 may infer components of the local variable nodes of the first data chunk having failed in the first sub-decoding operation and the third data chunk having failed in the second sub-decoding operation from the generated global check node. The second data chunk and the chip-kill chunk, on which the second sub-decoding operation succeeded, may be excluded. When the inferred components are changed because the inferred components are different from the existing components, the decoder 133 may update the local variable nodes of the first data chunk and/or the third data chunk to reflect the changed components.

However, the second decoder 1030 may infer the components of the local variable nodes corresponding to the target data chunk and the fail data chunk in different ways, depending on the types of the components of the global check node.

For example, when the components of the global check node are '0', the second decoder 1030 may infer the components of the local variable nodes corresponding to the target data chunk and the fail data chunk, respectively, using Equation 1:

$$L_{i \to j} = C_{atten} \prod_{j' \in N(i)-\{j\}} \alpha_{j'i} \cdot \min_{j' \in N(i)-\{j\}} \beta_{j'i} \qquad \text{[Equation 1]}$$

In Equation 1, '$L_{i \to j}$' represents a log-likelihood ration (LLR) transferred to a $j^{th}$ local variable node corresponding to the fail data chunk from an $i^{th}$ global check node. Furthermore, i and j are the same numbers.

'$C_{atten}$' represents a scaling factor for enabling the decoder 133 to smoothly perform the min-sum algorithm such as Equation 1.

'N(i)' represents a set of local variable nodes of a fail data chunk connected to the $i^{th}$ global check node. That is, referring to FIG. 13D, 'N(i)' represents two local variable nodes connected to the $i^{th}$ global check node.

'j'∈N(i)−{j}' represents $j'^{th}$ local variable nodes excluding the $j^{th}$ local variable node corresponding to the fail data chunk connected to the $i^{th}$ global check node among the set of local variable nodes of the fail data chunk. That is, 'j'' represents a $j'^{th}$ local variable node corresponding to a success data chunk.

'$\alpha_{j'i}$' represents the sign of an LLR transferred to the $i^{th}$ global check node from the $j'^{th}$ local variable node corresponding to the success data chunk. For example, when the corresponding component is '0', the LLR may exhibit a sign corresponding to '+'. When the component is '1', the LLR may exhibit a sign corresponding to '−'. However, this is only an example; the present invention is not limited thereto.

'$\beta_{j'i}$' represents the magnitude of an LLR transferred to the $i^{th}$ global check node from the $j'^{th}$ local variable node corresponding to the success data chunk, that is, reliability.

Referring to FIGS. 13B to 13E, the decoder 133 may infer components of the second local variable nodes of the first data chunk and/or the third data chunk from the second global check node of which the component is '0' in the global check node, using Equation 1.

Specifically, the decoder 133 may infer LLRs transferred to the second local variable nodes corresponding to the first data chunk and/or the third data chunk from '$L_{2\to 2}$', i.e., the second global check node. First, based on '$\Pi_{2'\in N(2)-(2)}\alpha_{2'2}$', the decoder 133 may calculate the signs of the LLRs transferred to the second global check node from the second local variable nodes corresponding to the second data chunk and the chip-kill chunk. Furthermore, based on $$\min_{j'\in N(i)-\{j\}} \beta'_{j'i},$$

the decoder 133 may calculate the minimum sum of the magnitudes of the LLRs transferred to the second global check node from the second local variable nodes of the second data chunk and the chip-kill chunk. By multiplying the calculated values by '$C_{atten}$', the decoder 133 may infer message information which is to be transferred to the second local variable nodes of the first and third data chunks from the second global check node.

On the other hand, when the components of the global check node are '1', the decoder 133 may infer the components of the local variable nodes using Equation 2.

$$L_{i\to j} = -C_{atten} \prod_{j'\in N(i)-\{j\}} \alpha_{j'i} \cdot \min_{j'\in N(i)-\{j\}} \beta_{j'i} \quad \text{[Equation 2]}$$

Equation 2 is different from Equation 1 in terms of only the sign.

Referring back to FIG. 13A, at step S1315, the decoder 133 may check whether the number of performed global decoding operations has reached a set repetition number. When the number of performed global decoding operations has reached the set repetition number ('Yes' at step S1315), the decoder 133 may determine that the corresponding global decoding operation failed.

When the number of global decoding operations performed has not reached the set repetition number ('No' at step S1315), the number of performed global decoding operations may be increased by one at step S1317, and the decoder 133 may repeat the first to fourth sub-decoding operations based on the updated local variable nodes at steps S1303 to S1313.

When there are no data chunks on which the second sub-decoding failed ('No' at step S1309), the decoder 133 may infer the components of the target data chunk by performing an XOR operation on the components of the success data chunks, i.e., the candidate data chunks and the chip-kill chunk at step S1319.

Figure 13E:
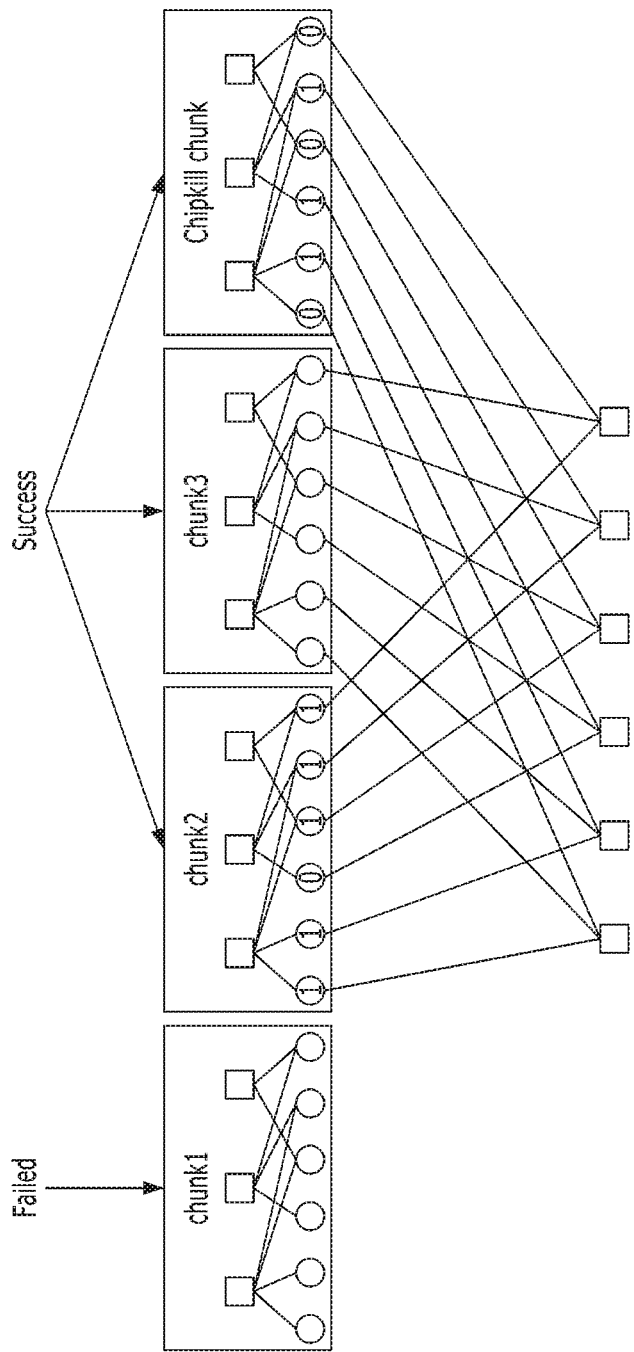

For example, when there are no fail data chunks as illustrated in FIG. 13E, the decoder 133 may infer the components of the first data chunk by performing an XOR operation on the components of the second and third data chunks and the chip-kill chunk.

For another example, when it is assumed that the components of the local variable nodes of the third data chunk are updated, the decoder 133 may succeed in the second sub-decoding operation on the third data chunk, based on the updated components, as illustrated in FIG. 13E. Then, at step S1311, the decoder 133 may perform the third sub-decoding operation to update the components of the global check node by performing an XOR operation on the components of the second and third data chunks and the chip-kill chunk. Furthermore, at step S1313, the decoder 133 may perform the fourth sub-decoding operation to infer the components of the local variable nodes of the first data chunk, based on the newly updated global check node.

Through the above-described methods, the decoder 133 in accordance with embodiments of the present disclosure may reduce the decoding cost for global decoding, and read data with high reliability. As a result, the decoder 133 of FIG. 10 may improve the overall performance of a memory system.

Although various embodiments have been illustrated and described, it will be apparent to those skilled in the art in light of the present disclosure that various changes and modifications may be made without departing from the spirit and scope of the invention as defined in the following claims.

For example, it has been described that the decoder 133 may infer the components of the local variable nodes of the fail data chunk using the min-sum algorithm. However, the decoder 133 may alternatively utilize other algorithms, e.g., the bit flipping algorithm, the weighted bit flipping algorithm and the sum-product decoding algorithm as well as the min-sum algorithm. Depending on the value of the global check node, the operation of the decoder 133 may be slightly modified.

Furthermore, the way in which the global check node is generated is not limited to a binary XOR operation, which has been exemplified. Alternatively, the global check node may be configured through a check node with non-binary LDPC codes. In this case, the number of the types of check nodes may be determined according to the size of GF(q) defining the corresponding global check node. For example, when a check node with binary LDPC codes is utilized, the global check node may be decoded with two binary values of 0 and 1, because the check node is a check node defined on GF(2).

Therefore, the scope of the present disclosure is not limited to the above-described embodiments, but may be defined by the following claims and the equivalents to the claims.

What is claimed is:

1. An operation method of a decoder that decodes a decoding operation on a data chunk basis, the operation method comprising:
  performing a first sub-decoding operation on a target data chunk;
  performing a second sub-decoding operation on candidate chunks and a chip-kill chunk corresponding to the target data chunk, when the first sub-decoding operation fails;
  performing a third sub-decoding operation to determine a global check node based on local variable nodes of data chunks, on which the second sub-decoding operation succeeded, as success data chunks, when there are one or more data chunks on which the second sub-decoding operation failed;
  performing a fourth sub-decoding operation to infer and update local variable nodes of the target data chunk and local variable nodes of a data chunk, on which the second sub-decoding operation failed, as fail data chunk, from the global check node; and repeating the first to fourth sub-decoding operations once by a set number of times based on components of the updated local variable nodes.

2. The operation method of claim 1, wherein, when the data chunk is a page unit, the data chunk comprises data stored in one page, the candidate data chunks and the chip-kill chunk are configured as the same super block as the target data chunk, and the chip-kill chunk comprises data generated from the target data chunk and the candidate data chunks through an exclusive OR (XOR) operation.

3. The operation method of claim 1, wherein, when the data chunk is an error correction code (ECC) chunk unit, the data chunk comprises data stored in a part of one page, the candidate data chunks and the chip-kill chunk are configured as the same super block as the target data chunk but stored in parts of different pages, and the chip-kill chunk comprises data generated from the target data chunk and the candidate data chunks through an exclusive OR (XOR) operation.

4. The operation method of claim 1, wherein, when the data chunk is an error correction code (ECC) chunk unit, the data chunk comprises data stored in a part of one page, the candidate data chunks and the chip-kill chunk comprise data stored in the same page as the target data chunk, and the chip-kill chunk comprises data generated from the target data chunk and the candidate data chunks through an exclusive OR (XOR) operation.

5. The operation method of claim 1, wherein the performing of the third sub-decoding operation comprises generating a component of an $i^{th}$ check node of the global check node through an exclusive OR (XOR) operation on components of $j^{th}$ local variable nodes of the success data chunks, wherein j and i are the same numbers.

6. The operation method of claim 1, wherein the performing of the fourth sub-decoding operation comprises inferring the local variable nodes of the fail data chunk using a min-sum algorithm.

7. The operation method of claim 6, wherein the performing of the fourth sub-decoding operation comprises inferring the local variable nodes of the fail data chunk by multiplying the product of the signs of log-likelihood ratios (LLRs) transferred to a first global check node from first local variable nodes of the success data chunks among local variable nodes connected to the first global check node by the minimum value among the magnitudes of the LLRs, when the component of the first global check node is '0'.

8. The operation method of claim 6, wherein the performing of the fourth sub-decoding operation comprises inferring the local variable nodes of the fail data chunk by inverting the sign of a value obtained by multiplying the product of the signs of log-likelihood ratios (LLRs) transferred to a second global check node from second local variable nodes of the success data chunks among local variable nodes connected to the second global check node by the minimum value among the magnitudes of the LLRs, when the component of the second global check node is '1'.

9. The operation method of claim 1, further comprising inferring the target data chunk from the success data chunks through an exclusive OR (XOR) operation, when all of the second sub-decoding operations succeeded.

10. The operation method of claim 1, further comprising setting all components of the global check node to '0' when all of the second sub-decoding operations failed.

11. The operation method of claim 1, further comprising determining that the decoding of the target data chunk failed, when the repeating operation is performed by the set number of times.

12. The operation method of claim 1, further comprising, when the first sub-decoding operation succeeded:
    determining that the decoding of the target data chunk succeeded; and
    outputting the target data chunk.

13. A decoder that decodes a decoding operation on a data chunk basis, the decoder comprising:
    a first decoder suitable for performing a first sub-decoding operation on a target data chunk, and performing a second sub-decoding operation on candidate data chunks and a chip-kill chunk corresponding to the target data chunk, when the first sub-decoding operation failed;
    a global check node component suitable for performing a third sub-decoding operation to determine a global check node based on local variable nodes of data chunks, on which the second sub-decoding operation failed, as success data chunks, when there are one or more data chunks on which the second sub-decoding operation failed; and
    a data combiner suitable for performing a fourth sub-decoding operation to infer and update local variable nodes of the target data chunk and local variable nodes of a data chunk, on which the second sub-decoding failed, as fail data chunk, from the global check node,
    wherein the decoder repeats the first to fourth sub-decoding operations once by a set number of times based on components of the updated local variable nodes.

14. The decoder of claim 13, wherein, when the data chunk is a page unit, the data chunk comprises data stored in one page, the candidate data chunks and the chip-kill chunk are configured as the same super block as the target data chunk, and the chip-kill chunk comprises data generated from the target data chunk and the candidate data chunks through an exclusive OR (XOR) operation.

15. The decoder of claim 13, wherein, when the data chunk is an error correction code (ECC) chunk unit, the data chunk comprises data stored in a part of one page, the candidate data chunks and the chip-kill chunk comprise configured as the same super block as the target data chunk but stored in parts of different pages, and the chip-kill chunk comprises data generated from the target data chunk and the candidate data chunks through an exclusive OR (XOR) operation.

16. The decoder of claim 13, wherein, when the data chunk is an error correction code (ECC) chunk unit, the data chunk comprises data stored in a part of one page, the candidate data chunks and the chip-kill chunk are data stored in the same page as the target data chunk, and the chip-kill chunk comprises data generated from the target data chunk and the candidate data chunks through an exclusive OR (XOR) operation.

17. The decoder of claim 13, further comprising:
    a fail data buffer suitable for receiving the target data chunk and the fail data chunk from the first decoder and storing the received data chunks; and
    a pass data buffer suitable for receiving the success data chunks from the first decoder and storing the received data chunks.

18. The decoder of claim 13, further comprising an exclusive OR (XOR) unit suitable for generating a component of an $i^{th}$ check node of the global check node through an XOR operation on components of $j^{th}$ local variable node of the success data chunks, where j and i are the same numbers.

19. The decoder of claim 13, wherein the data combiner infers local variable nodes of the fail data chunk by utilizing a min-sum algorithm.

20. The decoder of claim 19, wherein the data combiner infers the local variable nodes of the fail data chunk by multiplying the product of the signs of log-likelihood ratios (LLRs) transferred to a first global check node from first local variable nodes of the success data chunks among local variable nodes connected to the first global check node by the minimum value among the magnitudes of the LLRs, when the component of the first global check node is '0'.

21. The decoder of claim 19, wherein the data combiner infers the local variable nodes of the fail data chunk by inverting the sign of a value obtained by multiplying the product of the signs of log-likelihood ratios (LLRs) transferred to a second global check node from second local variable nodes of the success data chunks among local variable nodes connected to the second global check node by the minimum value among the magnitudes of the LLRs, when the component of the second global check node is '1'.

22. The decoder of claim 13, wherein when all of the second sub-decoding operations succeeded, the data combiner infers the target data chunk from the success data chunks through an exclusive OR (XOR) operation.

23. The decoder of claim 13, further comprising a decoder input buffer suitable for storing the local variable nodes of the success data chunks and the fail data chunk which are generated through the second sub-decoding operation and the local variable nodes of the target data chunk and the fail data chunk which are updated through the fourth sub-decoding operation.

24. The decoder of claim 13, wherein the global check node component sets all components of the global check node to '0' when all of the second sub-decoding operations failed.

25. The decoder of claim 13, wherein the decoder determines that the decoding of the target data chunk failed, when the repeating operation is performed by the set number of times.

26. The decoder of claim 13, wherein, when the first sub-decoding succeeded, the decoder determines that the decoding of the target data chunk succeeded, and outputs the target data chunk.

27. A memory system comprising:
a memory device suitable for storing data; and
a controller suitable for reading data from the memory device and decoding the read data,
wherein the controller comprises:
a first decoder suitable for performing a first sub-decoding operation on a target data chunk, and performing a second sub-decoding operation on candidate data chunks and a chip-kill chunk corresponding to the target data chunk, when the first sub-decoding operation failed;
a global check node component suitable for performing a third sub-decoding operation to determine a global check node based on local variable nodes of data chunks on which the second sub-decoding operation succeeded, as success data chunks, when there are one or more data chunks on which the second sub-decoding operation failed; and
a data combiner suitable for performing a fourth sub-decoding operation to infer and update local variable nodes of the target data chunk and local variable nodes of a data chunk on which the second sub-decoding operation failed, as fail data chunk, from the global check node,
wherein the decoder repeats the first to fourth sub-decoding operations once by a set number of times based on components of the updated local variable nodes.

28. The memory system of claim 27, wherein the data combiner infers local variable nodes of the fail data chunk by utilizing a min-sum algorithm.

29. The memory system of claim 27, wherein the data combiner infers the local variable nodes of the fail data chunk by multiplying the product of the signs of log-likelihood ratios (LLRs) transferred to a first global check node from first local variable nodes of the success data chunks among local variable nodes connected to the first global check node by the minimum value among the magnitudes of the LLRs, when the component of the first global check node is '0'.

30. The memory system of claim 27, wherein the data combiner infers the local variable nodes of the fail data chunk by inverting the sign of a value obtained by multiplying the product of the signs of log-likelihood ratios (LLRs) transferred to a second global check node from second local variable nodes of the success data chunks among local variable nodes connected to the second global check node by the minimum value among the magnitudes of the LLRs, when the component of the second global check node is '1'.

31. A decoder comprising:
a first decoder suitable for:
performing a first sub-decoding operation on a target data chunk, and
when the first sub-decoding operation failed, performing a second sub-decoding operation on candidate data chunks and a chip-kill chunk corresponding to the target data chunk; and
a second decoder suitable for:
when among the candidate data chunks and the chip-kill chunk, there is at least one data chunk on which the second sub-decoding operation failed, performing a third sub-decoding operation based on data chunks including data chunks on which the second sub-decoding operation succeeded to generate a global check node, and
performing a fourth sub-decoding operation on the target data chunk and the fail data chunk based on information of the global check node to update local variable nodes of the target data chunk for the first sub-decoding operation.

\* \* \* \* \*